US008732640B1

(12) United States Patent
Krishnan et al.

(10) Patent No.: US 8,732,640 B1
(45) Date of Patent: May 20, 2014

(54) METHODS, SYSTEMS, AND ARTICLES FOR MULTI-SCENARIO PHYSICALLY-AWARE DESIGN METHODOLOGY FOR LAYOUT-DEPENDENT EFFECTS

(75) Inventors: Prakash Krishnan, Wayne, NJ (US); Elias Fallon, Allison Park, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/282,362

(22) Filed: Oct. 26, 2011

(51) Int. Cl.
*G06F 17/50* (2006.01)

(52) U.S. Cl.
USPC .......................................................... 716/110

(58) Field of Classification Search
USPC .................................................. 716/100, 110
See application file for complete search history.

(56) References Cited

U.S. PATENT DOCUMENTS

| | | | |
|---|---|---|---|
| 5,544,067 A | 8/1996 | Rostoker et al. | |
| 6,360,350 B1 * | 3/2002 | Gabele et al. | 716/113 |
| 7,392,255 B1 | 6/2008 | Sholtis et al. | |
| 7,587,694 B1 * | 9/2009 | Henrickson et al. | 716/122 |
| 7,949,987 B1 | 5/2011 | Ginetti et al. | |
| 8,265,918 B1 | 9/2012 | Neema et al. | |
| 8,281,272 B1 * | 10/2012 | Ginetti | 716/119 |
| 2004/0261058 A1 | 12/2004 | Kundert | |
| 2006/0123377 A1 | 6/2006 | Schultz et al. | |
| 2010/0050138 A1 | 2/2010 | Chidambarrao et al. | |
| 2010/0083200 A1 | 4/2010 | Song et al. | |
| 2011/0107293 A1 | 5/2011 | Ganzhorn et al. | |
| 2011/0307854 A1 * | 12/2011 | Lu et al. | 716/119 |

OTHER PUBLICATIONS

Virtuoso® Analog Placer User Guide, Product Version 6.1.4, Nov. 2009.
Non-Final Office Action dated Jan. 10, 2013 for U.S. Appl. No. 13/282,426.
Final Office Action dated May 16, 2013 for U.S. Appl. No. 13/282,426.
Pimentel et al. ("A Systematic Approach to Exploring Embedded System Architectures at Multiple Abstraction Levels", IEEE, 2006, pp. 99-112).
Chen et al. ("Formal Verification of Embedded System Designs At Multiple Levels of Abstraction ", IEEE, 2002, pp. 125-130).
Non-Final Office Action dated Sep. 13, 2013 for U.S. Appl. No. 13/282,177.
Final Office Action dated Jan. 16, 2014 for U.S. Appl. No. 13/282,177.
Notice of Allowance dated Feb. 20, 2014 for U.S. Appl. No. 13/282,426.

\* cited by examiner

*Primary Examiner* — Suchin Parihar
(74) *Attorney, Agent, or Firm* — Vista IP Law Group, LLP

(57) ABSTRACT

Disclosed are methods, systems, and articles of manufacture for implementing multi-scenario physically-aware design of electronic circuit design(s). In some embodiments, the method captures layout dependent effect(s) when a critical component instance, which corresponds to multiple candidate configurations, is being created in a physical design to enable a designer to create partial layout(s) from layout alternative(s) and to extract parameter(s) from the partial layout(s) in different layout contexts. The method may extract parasitics between components and analyzes impact(s) of layout dependent effect(s) on an electronic design by performing simulation(s) with layout dependent effect(s) in the schematic domain and may perform some partial routing based on some routing style(s) in each of the different layout contexts to generate just enough interconnects that may affect the electronic design.

44 Claims, 16 Drawing Sheets

| SCP MAP | | | Intrinsic Parameters | | | | Extrinsic Parameters | | | |
|---|---|---|---|---|---|---|---|---|---|---|
| SCP | Layout View | Extracted View | <Param1 .Name> | <Param2 .Name> | ... | <ParamM .Name> | <Param1 .Name> | <Param2 .Name> | ... | <ParamN. Name> |
| 1 | Layout. 1 | Extracted .1 | value1 | value2 | ... | ValueM | Value1 | Value2 | ... | ValueN |
| 2 | Layout. 2 | Extracted .2 | value1 | value2 | ... | ValueM | Value1' | Value2' | ... | ValueN' |
| ... | ... | ... | ... | ... | ... | ... | ... | ... | ... | ... |
| ... | ... | ... | ... | ... | ... | ... | ... | ... | ... | ... |
| ... | ... | ... | ... | ... | ... | ... | ... | ... | ... | ... |
| P | ... | ... | ... | ... | ... | ... | ... | ... | ... | ... |

FIG. 5

METHODS, SYSTEMS, AND ARTICLES FOR MULTI-SCENARIO PHYSICALLY-AWARE DESIGN METHODOLOGY FOR LAYOUT-DEPENDENT EFFECTS

CROSS-REFERENCE TO RELATED APPLICATION(S)

This application is cross-related to U.S. patent application Ser. No. 13/282,426 and, filed concurrently and entitled "METHODS, SYSTEMS, AND ARTICLES FOR IMPLEMENTING EXTRACTION AND ELECTRICAL ANALYSIS-DRIVEN MODULE CREATION", and U.S. patent application Ser. No. 13/282,177 and, filed concurrently and entitled "METHODS, SYSTEMS, AND ARTICLES OF MANUFACTURE FOR CREATING OR MANIPULATING ELECTRICAL DATA SETS FOR AN ELECTRONIC DESIGN". The content of both applications is hereby expressly incorporated by reference in its entirety.

BACKGROUND

The recent advances in very deep sub-micron (VDSM) integrated circuits (ICs) have brought new challenges in the physical design methodology process of integrated systems. In modern electronic circuits, geometries become smaller; clock frequencies increase; and on-chip interconnections gain increased importance in the prediction of performance. Nonetheless, it has been found that from 0.13 μm and below, the layout of an electronic design exhibits profound impacts on device electrical parameters, especially in sub-45 nm nodes. For example, stress effects caused by the length of oxide (LOD) definition or shallow trench isolation (STI) features impact the mobility ($\mu_{eff}$), carrier saturation velocity ($V_{sat}$), or threshold voltage ($V_{th}$) of metal-oxide-semiconductor (MOS) transistors. Well-proximity effect (WPE) also cause significant variation in the threshold voltages depending on the proximity of CMOS (complementary metal-oxide-semiconductor) transistors to an implant well boundary. In addition, a typical design flow often uses various design rules and layout guidelines such as dummy components in module, well creation guidelines, device matching guidelines, etc. to minimize such layout dependent effects by verifying the physical design during sign-off via extraction and re-simulation through multiple iterations. If such verification fails, the design process reverts back to the layout or even back to the schematic design stage and repeats the schematic, layout, and verification process flow iteratively in order to meet a final layout with acceptable performance or manufacturing criteria.

Thus, there exists a need for implementing multi-scenario physically-aware design of an electronic circuit design that captures layout dependent effects among various devices or components early in the design flow such that the impact of such layout-dependent effects may be analyzed during the schematic design stage as well as the physical design stage.

SUMMARY

Disclosed are a method, a system, and an article of manufacture for implementing multi-scenario physically-aware design of an electronic circuit design. In various embodiments, the method or the system captures layout dependent effects in an electronic design early in the design process. In some embodiments, the method or the system captures layout dependent effects in an electronic design when an instance of a critical component, which corresponds to multiple candidate configurations, is being created in a physical design. In some embodiments, the method or the system enables a designer to create one or more partial, incomplete layouts with one or more critical components and to extract various parameters, such as component parameters or layout dependent parameters, from these one or more partial, incomplete layouts in different layout contexts.

In some embodiments, the method or the system may further extract parasitics between components in a context of the layout. In some embodiments, the method and the system analyzes the impact of layout dependent effects on the performance of an electronic circuit by performing one or more simulations with these layout dependent effects in the schematic domain. Multiple layout alternatives may be generated on the fly or in advance and may be used to generate the one or more partial, incomplete layouts by placing the same one or more critical components in the different layout contexts in some embodiments. The method or the system may further perform some partial routing based on some routing style(s) in each of the different layout contexts to generate just enough interconnects that may affect the performance of the one or more critical components.

In some embodiments, the method may comprise the process for using at least one processor or at least one processor core that executes one or more threads to perform an action of identifying or creating multiple layout alternatives for a parameterized block, cell, component, feature, device, etc. (hereinafter parameterized cell or parameterized block) of the electronic circuit design. In some embodiments, a critical component may be modeled as a parameterized cell.

In some embodiments, the method may further comprise the process for generating multiple layout scenarios using at least some of the multiple layout alternatives in multiple contexts for the parameterized cell. In some embodiments, the method may further comprise the process for characterizing each of the multiple layout scenarios and for storing the result of the process for characterizing the each of the multiple layout scenarios in one or more data structures on a non-transitory computer readable medium.

In some embodiments, the method may further include identifying or receiving an input comprising a component parameter and a parameterized cell parameter for the parameterized cell, where a component parameter corresponds to multiple component parameter values, and a parameterized cell parameter corresponds to multiple block parameter values. Various embodiments disclosed herein perform the intended functions and achieve the intended purposes even when a layout alternative for a parameterized cell includes only a partial, incomplete layout of an electronic design, where the partial, incomplete layout includes only an instance or a layout alternative of a critical component and a single net interconnecting the parameterized cell.

The method may further optionally include the process of identifying a context for an instance of the parameterized cell in the electronic circuit design in some embodiments, where the context may include or correspond to various information about the surrounding components or features within certain proximity of the parameterized cell, various design or operating rules, conditions, or requirements for the parameterized cell or its surrounding features or components, etc. In some embodiments, the method may further include the process of selecting a layout alternative from the multiple layout alternative for the instance of the parameterized cell for the context.

In some embodiments, the method that invokes at least one processor or at least one processor core to identify or create multiple layout alternatives may further include a sub-process of identifying a component parameter value for a component parameter of the parameterized cell. In these embodiments, the method may further include the sub-process of identifying or determining a block parameter value for a block parameter of the parameterized cell, the sub-process of identifying or determining an inter-component or an inter-component constraint for the parameterized cell.

In some other embodiments, the method that invokes at least one processor or at least one processor core to identify or create multiple layout alternatives may further include a sub-process of identifying or determining a dummy component that is included in or with the parameterized cell in one of the multiple layout alternatives, a sub-process of identifying or determining an additional component to be included in or with the parameterized cell in one of the multiple layout alternatives, a sub-process of adjusting a location or an orientation of a component that is included in or with the parameterized cell in one of the multiple layout alternatives, and a sub-process of identifying or determining a pattern of one or more components that are included in or with the parameterized cell. In these embodiments, the method that invokes the at least one processor or the at least one processor core to adjust the location or the orientation of the component may further optionally include at least one of the sub-process of aligning the component with one or more other components in the electronic circuit design and the sub-process of determining a custom spacing between the component and another component in the electronic circuit design.

In some embodiments, the method that invokes at least one processor or at least one processor core to generate multiple layout scenarios may further optionally include the sub-process of performing placement for a layout alternative of the multiple layout alternatives in a context of the multiple contexts, the sub-process of performing partial routing for the parameterized cell to create an interconnect based at least in part upon the placement for the layout alternative, and the sub-process of creating a layout scenario of the multiple layout scenarios based at least in part upon the placement and the partial routing.

In some embodiments, the method that invokes at least one processor or at least one processor core to characterize each of the multiple layout scenarios may further optionally include the sub-process of identifying a first layout scenario corresponding to a first set of scenario parameters and a first view of first layout scenario, the sub-process of identifying a first extracted view of the first layout scenario based at least in part upon the first set of parameters, the sub-process of capturing an intrinsic parameter for the parameterized cell based at least in part upon the first extracted view, and the sub-process of capturing an extrinsic parameter for the parameterized cell based at least in part upon the first extracted view.

In some embodiments, the method that invokes at least one processor or at least one processor core to characterize each of the multiple layout scenarios may further optionally include the sub-process of identifying, determining, or updating physical data of the first layout scenario, the sub-process of characterizing an electrical parasitic associated with the physical data, the sub-process of characterizing an electrical characteristic associated with the electrical parasitic or the physical data, the sub-process of identifying or determining a constraint associated with the electrical characteristic, and the sub-process of ensuring correctness of the physical data or other physical data related to the constraint.

In some of these embodiments, the method may further optionally include the sub-process of performing a schematic simulation for the electronic circuit design, the sub-process of assembling at least current or voltage information based at least in part upon a result of the schematic simulation, and the sub-process of determining the electrical characteristic in a physical domain by using a solver. In some of these embodiments, the method may also optionally invoke the at least one processor or the at least one processor core to perform the sub-process of forming a matrix by using at least the electrical parasitic, the sub-process of determining a first electrical characteristic by using at least the matrix, and the sub-process of determining the electrical characteristic by using at least the first electrical characteristic.

Some embodiments are directed at a method for implementing multi-scenario physically-aware design of an electronic design. In these embodiments, the method for implementing multi-scenario physically-aware design of an electronic design may comprise the sub-process of identifying or generating a physical design of at least a part of the electronic design, the sub-process of identifying a layout scenario from multiple layout scenarios, the layout scenario comprising a parameterized cell, the sub-process of updating the physical design by using a first instance of the parameterized cell in the layout scenario, and the sub-process of performing at least one of scenario recognition, scenario lookup, and scenario switch. In some of these embodiments, the method may further optionally include at least one of the sub-process of describing the first layout scenario by creating a physical configuration for the first layout scenario and the sub-process of receiving identification for the first layout scenario from a user.

In some embodiments, the method that invokes the at least one processor or the at least one processor core to perform the scenario switch may further optionally include at least one of the sub-process of performing automatic scenario switch without requiring human intervention and the sub-process of performing assisted scenario switch by interacting with a user to provide the user with an option to modify an intrinsic parameter or an extrinsic parameter of the parameterized cell.

In addition or in the alternative, the method that invokes the at least one processor or the at least one processor core to perform automatic scenario switch may also optionally include at least one of the sub-process of performing automatic placement, floorplanning, or routing to improve a cell-view of at least a part of the first layout scenario and the sub-process of performing automatic placement, floorplanning, or routing to improve an intrinsic parameter or an extrinsic parameter for the first instance of the parameterized cell.

In some embodiments where the method that invokes the at least one processor or the at least one processor core to perform the scenario recognition or scenario lookup, the method may further optionally include at least one of the sub-process of identifying an intrinsic parameter or an extrinsic parameter for the first instance, the sub-process of determining whether the intrinsic parameter or the extrinsic parameter for the first instance matches with a first parameter of a first layout scenario in a data structure, and the sub-process of updating the physical design with the first layout scenario, wherein the first parameter of the first layout scenario is determined to match with the intrinsic parameter or the extrinsic parameter.

In some of these embodiments, the method may also optionally include the sub-process of updating the physical design with a second layout scenario, wherein the first parameter of the first layout scenario is determined not to match with the intrinsic parameter or the extrinsic parameter, and a second parameter of the second layout scenario is determined to be a closest match with the intrinsic parameter or the extrinsic parameter. In addition, the method may further optionally include at least one of the sub-process of characterizing the physical design based at least in part upon the second layout scenario and the sub-process of reporting a layout switch violation, wherein the first parameter of the first layout scenario is determined not to match with the intrinsic parameter or the extrinsic parameter, and a second parameter of the second layout scenario is determined to be a closest match with the intrinsic parameter or the extrinsic parameter.

Some embodiments are directed at a hardware system that may be invoked to perform any of the methods, processes, or sub-processes disclosed herein. The hardware system may include at least one processor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Over section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Over section below.

BRIEF DESCRIPTION OF THE DRAWINGS

The drawings illustrate the design and utility of various embodiments of the present invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIG. 5 illustrates an exemplary data structure for storing various data or information corresponding to multiple layout scenarios in some embodiments.

DETAIL DESCRIPTION

Figure 1A:
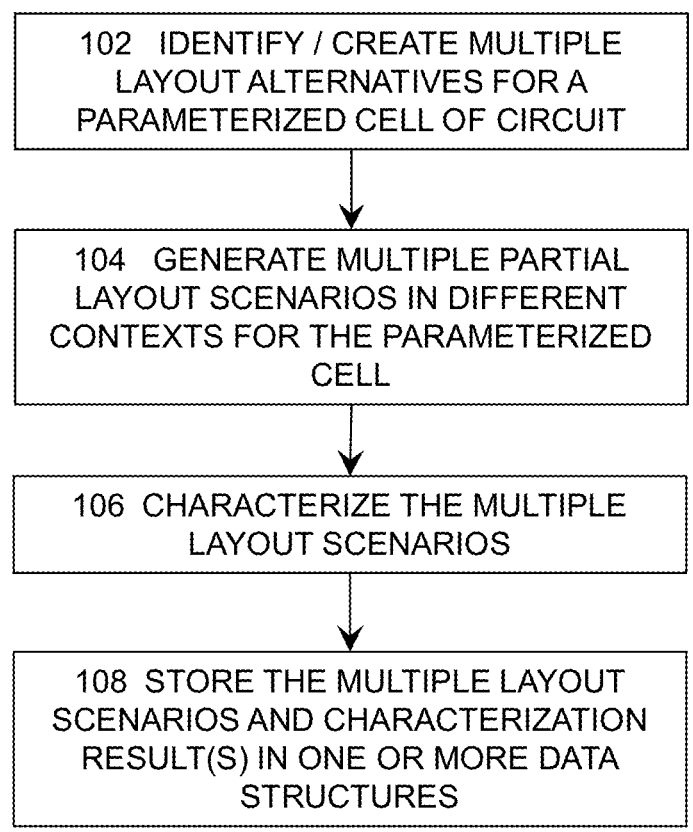
FIG. 1A illustrates a high level block diagram for implementing multi-scenario physically-aware design of an electronic circuit design in some embodiments.

Various embodiments of the invention are directed to a methods, systems, and articles of manufacture for implementing multi-scenario physically-aware design of an electronic circuit design in a single embodiment or in some embodiments. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Disclosed are a method, a system, and an article of manufacture for implementing multi-scenario physically-aware design of an electronic circuit design. In various embodiments, the method or the system captures layout dependent effects in an electronic design early in the design process. Some embodiments provide multiple possible layout scenarios for, for example, a feature, a component, a device, a module, a net, or a part of a new of an electronic design (hereinafter component) and enable a designer to capture such layout dependent effects at the time when the component is being created, placed, routed, or optimized by identifying one of the multiple possible layout scenarios that exactly or approximately fits the particular context in which an instance of the component is situated.

Various disclosed processes, sub-processes, methods, or hardware modules disclosed herein eliminate the need to manually hand off various design rules, device matching guidelines, module or component creation guidelines, other layout guidelines, etc. from a schematic designer to a layout designer. Some embodiments may further eliminate the need for performing extraction, re-simulation, or verification for a physical design after the completion of the physical design (e.g., during sign-off) and allow the designers to analyze the effects or impacts of layout-dependent effects during the schematic design stage as well as the layout design stage.

In some embodiments, the method or the system enables a designer to create one or more partial, incomplete layouts with one or more critical components and to extract various parameters, such as component parameters or layout dependent parameters, from these one or more partial, incomplete layouts in different layout contexts. Multiple layout alternatives may be generated on the fly or in advance and may be used to generate the one or more partial, incomplete layouts by placing the same one or more critical components in the different layout contexts in some embodiments. The method or the system may further perform some partial routing based at least in part upon some routing style(s) in each of the different layout contexts to generate just enough interconnects that may affect the performance of the one or more critical components.

The method or the system first identifies or creates multiple layout alternatives for a parameterized cell in some embodiments. In some embodiments, a parameterized cell comprises a master cell that has one or more parameters, and, in the context of electronic designs in the physical domain, an instance of the parameterized cell may be instantiated in a physical design (e.g., a layout) with values for the one or more parameters. A different instance of the parameterized cell may be instantiated by changing the values for the one or more parameters without changing the master cell. Some exemplary parameters may comprise geometric information such as width(s), length(s), orientation, alignment of various features, spacing between two features, pattern(s) of one or more features, or the total number of a feature in a cell instance, etc. It shall be noted that this list is not intended to be exhaustive, and that a parameterized cell may comprise or define other parameters.

The method or the system is then to generate multiple layout scenarios using at least some of the multiple layout alternatives in multiple layout contexts for the parameterized cell and to characterize each of the multiple layout scenarios in some embodiments. The characterization results may be stored in one or more data structures in some embodiments. In various embodiments, the one or more data structures comprise one or more incomplete layout scenarios, each of which encompasses at least one layout alternative of one or more parameterized cells.

The one or more data structure may further comprise an index or a unique identifier, which may be used to index or identify the corresponding layout scenario in some embodiments. The one or more data structure may also include, for each layout scenario, one or more intrinsic or extrinsic parameters and their corresponding values for corresponding parameterized cell(s), one or more scenario alternatives of one or more parameterized cell(s), an extracted views for the corresponding layout scenario layout, etc. Throughout this disclosure, the one or more data structures are collectively referred to as a scenario parameter table or a scenario table.

More details about various processes or modules are provided below with reference to respective drawing figure(s).

FIG. 1A illustrates a high level block diagram for implementing multi-scenario physically-aware design of an electronic circuit design in some embodiments. In one or more embodiments, the method or the system for implementing multi-scenario physically-aware design of an electronic circuit design may invoke a computing system and may comprise the respective process or hardware module 102 of identifying or creating multiple layout alternatives for a parameterized cell of an electronic circuit. In some embodiments, the parameterized cell may be created to represent one or more classes of electronic components, such as but not limited to, a multi-finger MOSFET (metal-oxide-semiconductor field-effect transistor).

In some embodiments, the method or the system may also comprise the respective process or hardware module 104 of generating multiple partial layout scenarios in different layout contexts for the parameterized cell. For example, the method or the system may create a first partial layout scenario that comprises a MOSFET that includes a first number of fingers or needs to meet a first performance requirement and a second partial layout scenario that comprises a MOSFET that includes a second number of fingers or needs to meet a second performance requirement.

As another example, the method or the system may create a first partial layout scenario that comprises a component with a first requirement (e.g., a requirement for spacing, routing, performance, etc.) and a second partial layout scenario that comprises the same component with a second requirement. In some embodiments, the method or the system may also comprise the respective process or hardware module 106 of characterizing at least one of the multiple, partial layout scenarios. In some embodiments, the method or the system may characterize at least one of the multiple, partial layout scenarios by performing simulation(s) to determine various electrical or performance related characteristics. In some embodiments, the method or the system may also comprise the respective process or hardware module 108 of storing the multiple, partial layout scenarios and the characterization result(s) in a scenario parameter table.

It shall be noted that although some embodiments described herein encompass a parameterized cell, a similar approach may also apply to other components that are not parameterized. In some embodiments, the method or the system may also comprise the respective process or hardware module of identifying or creating multiple layout alternatives for a non-parameterized component of an electronic circuit. It shall also be noted that the layout scenario needs not necessarily be a partial, incomplete layout; rather, at least one of the multiple layout scenarios may include a complete layout of the entire electronic circuit design.

Figure 1B:
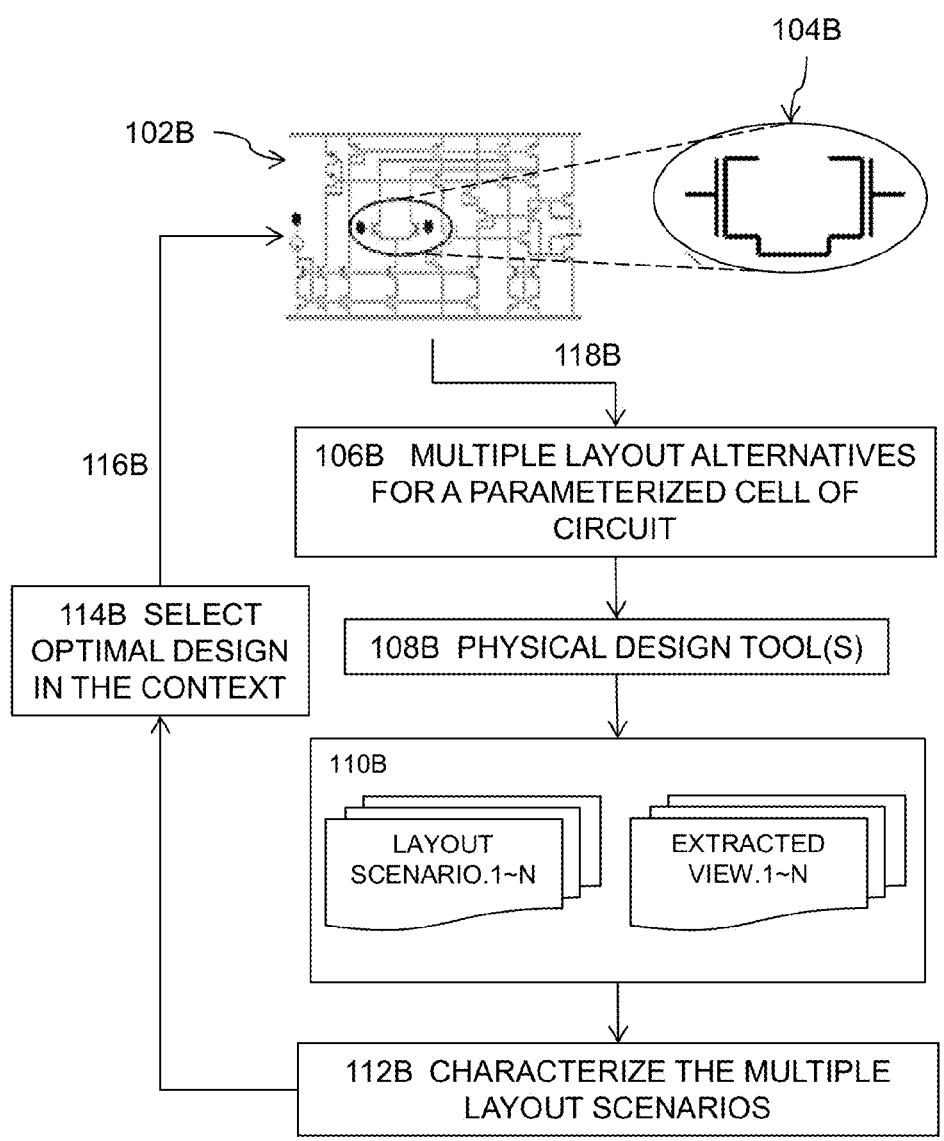
FIG. 1B illustrates a high level block diagram for implementing multi-scenario physically-aware design of an electronic circuit design in some embodiments.

FIG. 1B illustrates a high level block diagram for implementing multi-scenario physically-aware design of an electronic circuit design in some embodiments. In some embodiments, the method or the system may invoke a system to identify or create a schematic design 102B for the electronic circuit design. The schematic design may comprise a schematic instance of a parameterized cell 104B. The method or the system may then invoke the respective process or hardware module 106B to identify or generate multiple, partial layout alternatives for a parameterized cell in the electronic design.

The method or the system may then invoke the respective process or hardware module 108B of one or more physical design tools (e.g., a circuit layout tool) to create one or more layout scenarios 110B for the parameterized cell. The method or the system may then characterize at least one of the multiple layout scenarios at 112B and selects one layout scenario from the multiple layout scenarios at 114B. The method or the system may further send information or data from the physical domain (e.g., the characterization results from 112B, electrical data such as voltages, currents, etc., parasitics, etc.) to the schematic design environment via 116B in some embodiments. In these embodiments, the schematic design tool for the schematic design 102S may also pass additional information or data (e.g., schematic simulation results, etc.) to the physical design tool such that the physical design tools via 118B in the physical domain are made aware of such information or data at the beginning of the physical design stage.

Figure 1C:
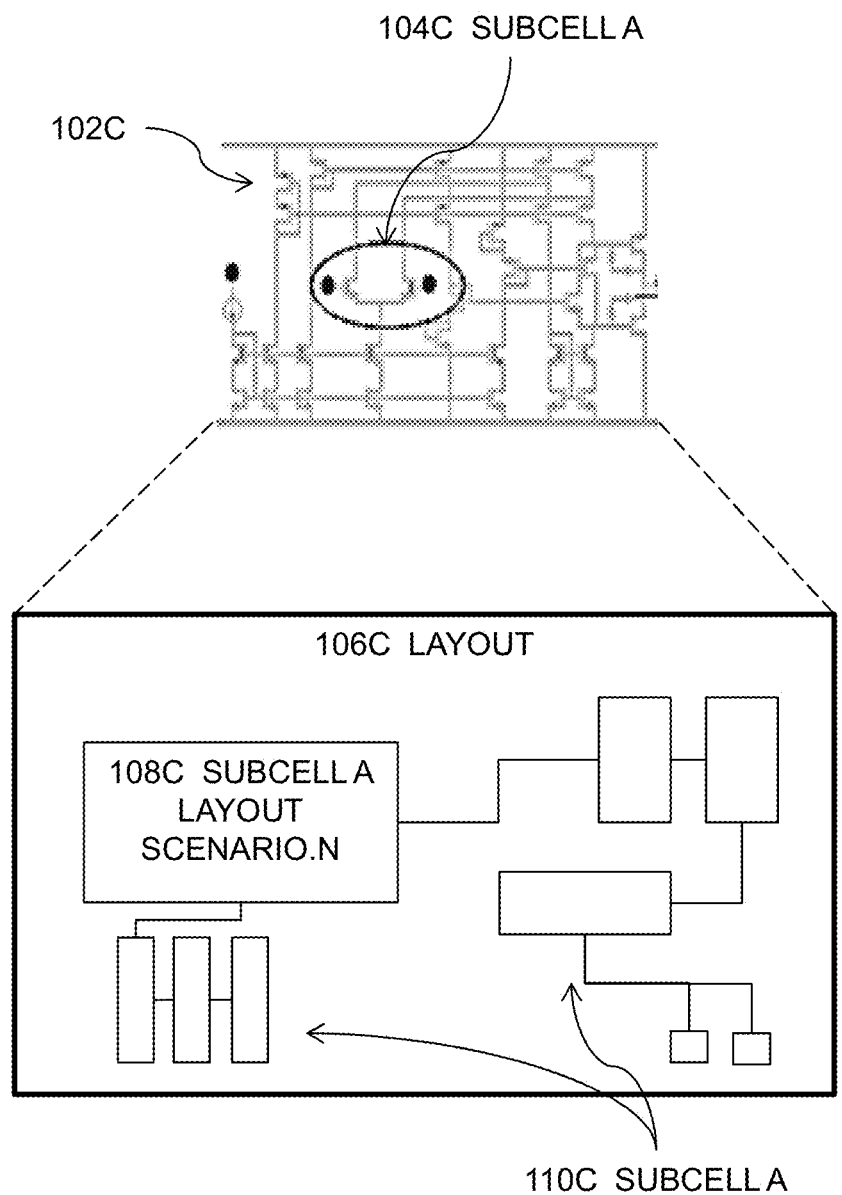
FIG. 1C illustrates an exemplary schematic electronic design with a schematic instance of a parameterized cell in the schematic domain and the corresponding exemplary layout scenario of the same parameterized cell in the physical domain.

FIG. 1C illustrates an exemplary schematic electronic design with a schematic instance of a parameterized cell in the schematic domain and the corresponding exemplary layout scenario of the same parameterized cell in the physical domain. More particularly, FIG. 1C illustrates an exemplary schematic design 102C of an electronic design that includes a schematic instance of a parameterized cell 104C (subcell A). FIG. 1C further illustrates the corresponding layout 106C of the electronic design that includes an instance 108C corresponding to the schematic instance subcell A 104C. The layout 106C may further comprise other components 110C such as one or more neighboring components, abutting components, dummy components, etc.

Figure 2:
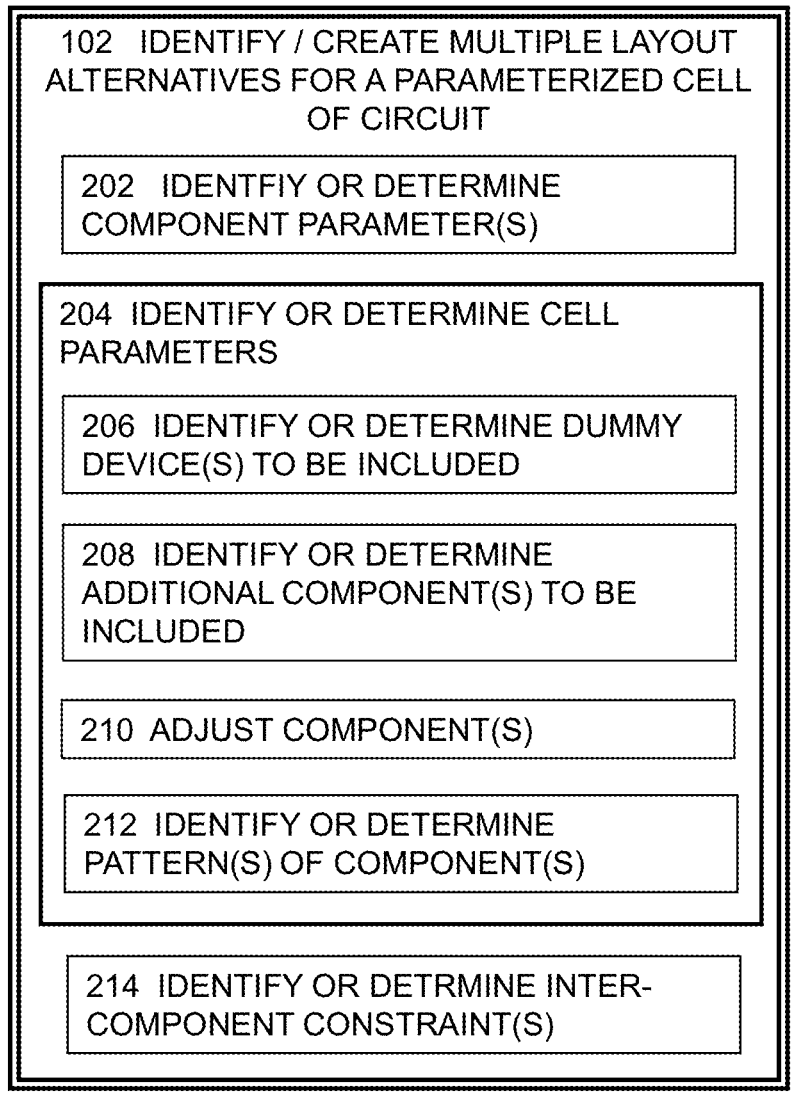
FIG. 2 illustrates more details for a sub-process or sub-module to identify or generate multiple layout alternatives for a parameterized cell of electronic circuit in some embodiments.

FIG. 2 illustrates more details for a sub-process or sub-module to identify or generate multiple layout alternatives for a parameterized cell of electronic circuit in some embodiments. More particularly, FIG. 2 illustrates more details about the process or module 102 for identifying or creating multiple layout alternatives for a parameterized cell in some embodiments. In some embodiments, the process or hardware module 102 may comprise the respective process or module 202 for identifying or determining one or more component parameters.

In some embodiments, the method or the system uses the one or more component parameters to capture layout dependent effects that comprise, for example but not limited to, length of oxide definition (LOD), shallow trench isolation (STI) features, electrical or mechanical stress effects, stress effect impact mobility ($\mu_{eff}$), carrier saturation velocity ($V_{sat}$), threshold voltage ($V_{th}$) of MOS (metal-oxide-semiconductor) transistors, or well-proximity effect. In some embodiments, the one or more component parameters comprise parasitic information or data in either a proprietary format or in a standard format such as the Standard Parasitic Exchange Format (SPEF), and the parasitic information or data may comprise, for example, various forms of resistance, capacitance, or inductance, etc.

In some embodiments, the one or more component parameters comprise one or more intrinsic parameters that comprise, for example but not limited to, one or more device parameters or one or more module creation parameters. The one or more device parameters may comprise, for example, one or more device properties, one or more parameters for component description, or one or more parameters for the parameterized cell. In addition or in the alternative, the one or more intrinsic parameters may comprise one or more parameters for module creation, module generation, or module compilation (collectively module creation) such as interdigitation pattern(s), dummy device(s), body contact(s), guard ring(s), abutting component(s), custom device spacing, routing criteria or style(s), etc. The one or more extrinsic parameters may comprise any parameters, such as the right-well-edge-distance parameter, that may affect the layout context in which an instance of the parameterized cell is placed.

In some embodiments, the process or hardware module 102 may comprise the respective process or module 204 for identifying or determining one or more cell parameters. The process or module 204 for identifying or determining one or more cell parameters may comprise the respective process or module 206 for identifying or determining one or more dummy components that are to be included in one or more layout alternatives in some embodiments. In some embodiments, the process or module 204 for identifying or determining one or more cell parameters may comprise the respective process or module 208 for identifying or determining one or more additional components that are to be included in at least one of the multiple layout alternatives.

In some embodiments, the one or more additional components may comprise, for example but not limited to, one or more abutting components, guard rings, custom components, any combinations thereof, some interconnects or any other components that may affect the performance of a layout alternative in the electronic design, etc. In some embodiments, the process or module 204 for identifying or determining one or more cell parameters may comprise the respective process or module 210 for adjusting one or more components which may further include the respective sub-process or sub-module of aligning one component with another component in a layout alternative or the sub-process or sub-module of changing or using custom device spacing between two components.

In some embodiments, the process or module 204 for identifying or determining one or more cell parameters may comprise the respective process or module 212 for identifying or determining a pattern of a component in a layout alternative. For example, the process or module 204 may determine the number of instances of a component in a pattern or the arrangement of the relative locations of the instances of a component in a pattern. In some embodiments, the process or hardware module 102 may comprise the respective process or module 214 for identifying or determining one or more inter-component constraints in a layout alternative.

Figure 3:
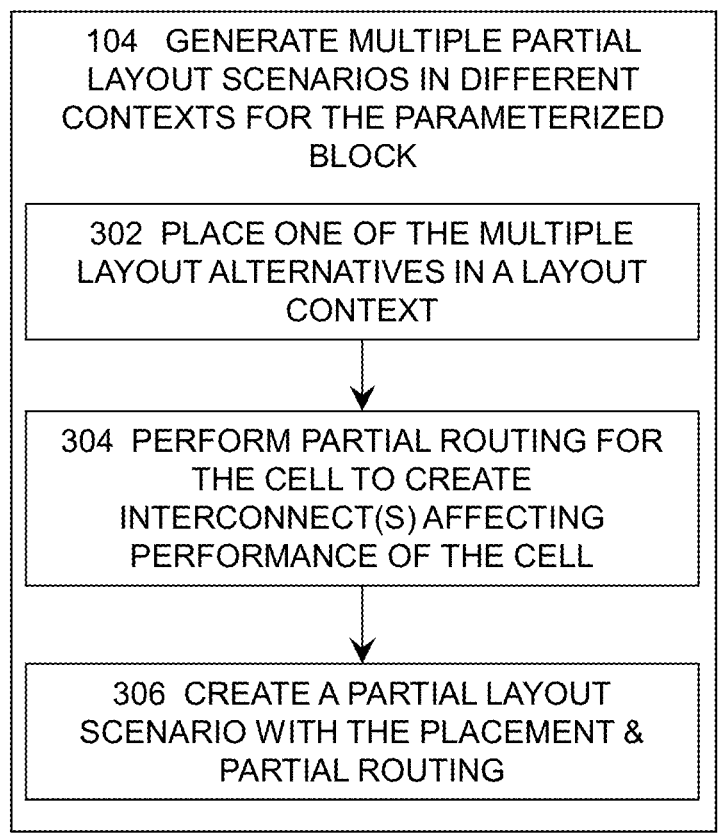
FIG. 3 illustrates more details for the sub-process or sub-module for generating multiple partial layout scenarios in different layout context for a parameterized cell of electronic circuit in some embodiments.

FIG. 3 illustrates more details for the sub-process or sub-module for generating multiple partial layout scenarios in different layout context for a parameterized cell of electronic circuit in some embodiments. More specifically, FIG. 3 illustrates more details about the process or hardware module 104 for generating multiple partial layout scenarios in different layout contexts for the parameterized cell in some embodiments. In these embodiments, the process or hardware module 104 may comprise the respective process or hardware module 302 for placing one of the multiple layout alternatives for the parameterized cell in a layout context for a layout scenario of the multiple layout scenarios.

In some embodiments, the process or the hardware module 302 may further place one or more additional components outside the selected layout alternative of the parameterized cell based on the layout context so as to capture the layout dependent effects caused by these one or more additional components. In some embodiments, the process or hardware module 104 may comprise the respective process or hardware module 304 for performing partial routing for the instance of the parameterized cell in the layout scenario to create one or more interconnects that may affect the performance of the parameterized cell in the particular layout context. In some embodiments, the process or hardware 304 module performs internal routing within the instance of the parameterized cell. In some embodiments, the process or hardware module 104 may comprise the respective process or hardware module 306 for generating a layout scenario based at least in part upon the placement at 302 and the partial routing results.

Figure 4A:
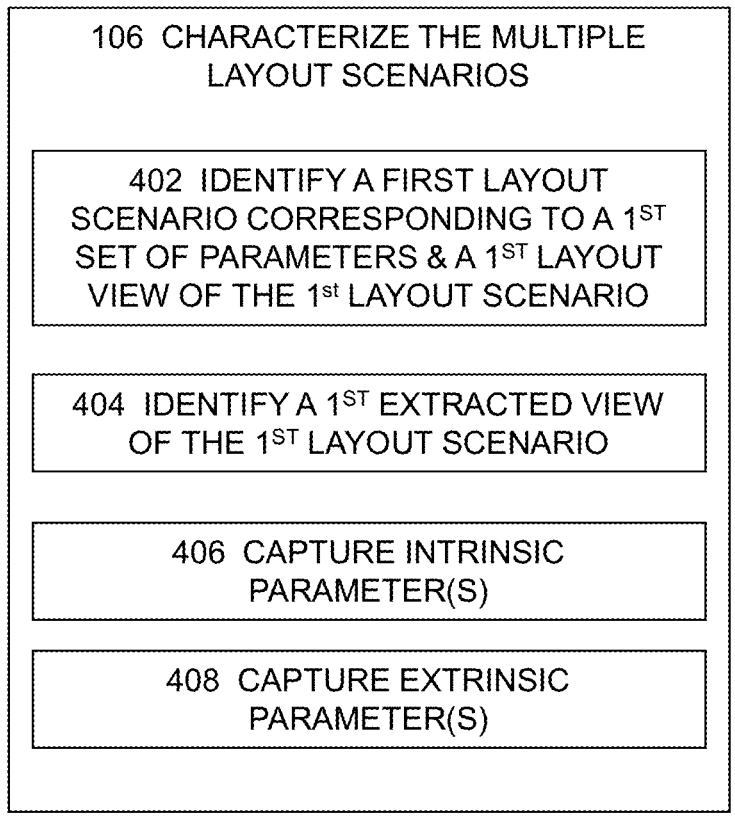
FIG. 4A illustrates more details for a sub-process or sub-module for characterizing the multiple layout scenarios in some embodiments.

FIG. 4A illustrates more details for a sub-process or sub-module for characterizing the multiple layout scenarios in some embodiments. More specifically, FIG. 4A illustrates more details about the process or hardware module 106 characterizing at least one of the multiple, partial layout scenarios in some embodiments. In some embodiments, the process or hardware module 106 may comprise the respective process or hardware module 402 for identifying a first layout scenario that corresponds to a first set of parameters and a first layout view of the first layout scenario. The first set of parameters may comprise any parameters described above with reference to FIG. 2.

In some embodiments, the process or hardware module 106 may comprise the respective process or hardware module 404 for identifying a first extracted view of the first layout scenario. In some embodiments, the first extracted view comprises the values associated with the components in the first layout scenario where the values may be directly extracted from the first layout scenario or may be determined by using some directly extracted values and additional computation. For example, the first extracted view may comprise geometric information of various shapes in the first layout scenario, where the geometric information may be directly extracted from the first layout scenario. As another example, the first extracted view may also comprise some electrical characteristics associated with the first layout scenario or a component thereof, where an electrical characteristic, for example electrical resistance (R), may be determined based on the cross-sectional area and length of an interconnect that may be directly extracted from the first layout scenario, the operating temperature(s), and material properties (e.g., electrical resistivity and the temperature coefficient of resistivity) of the interconnect.

In some embodiments, the process or hardware module 106 may comprise the respective process or hardware module 406 for identifying or capturing one or more intrinsic parameters. In some embodiment, an intrinsic parameter comprises a parameter that is within, relating to, or is associated with the parameterized cell. Some exemplary intrinsic parameters are provided above in the description of FIG. 2. In some embodiments, the process or hardware module 106 may comprise the respective process or hardware module 408 for identifying or capturing one or more extrinsic parameters. In some embodiment, an extrinsic parameter comprises a parameter that is relating to or is associated with one or more additional components outside of the parameterized cell in the layout scenario. Some exemplary extrinsic parameters are provided above in the description of FIG. 2.

Figure 4B:
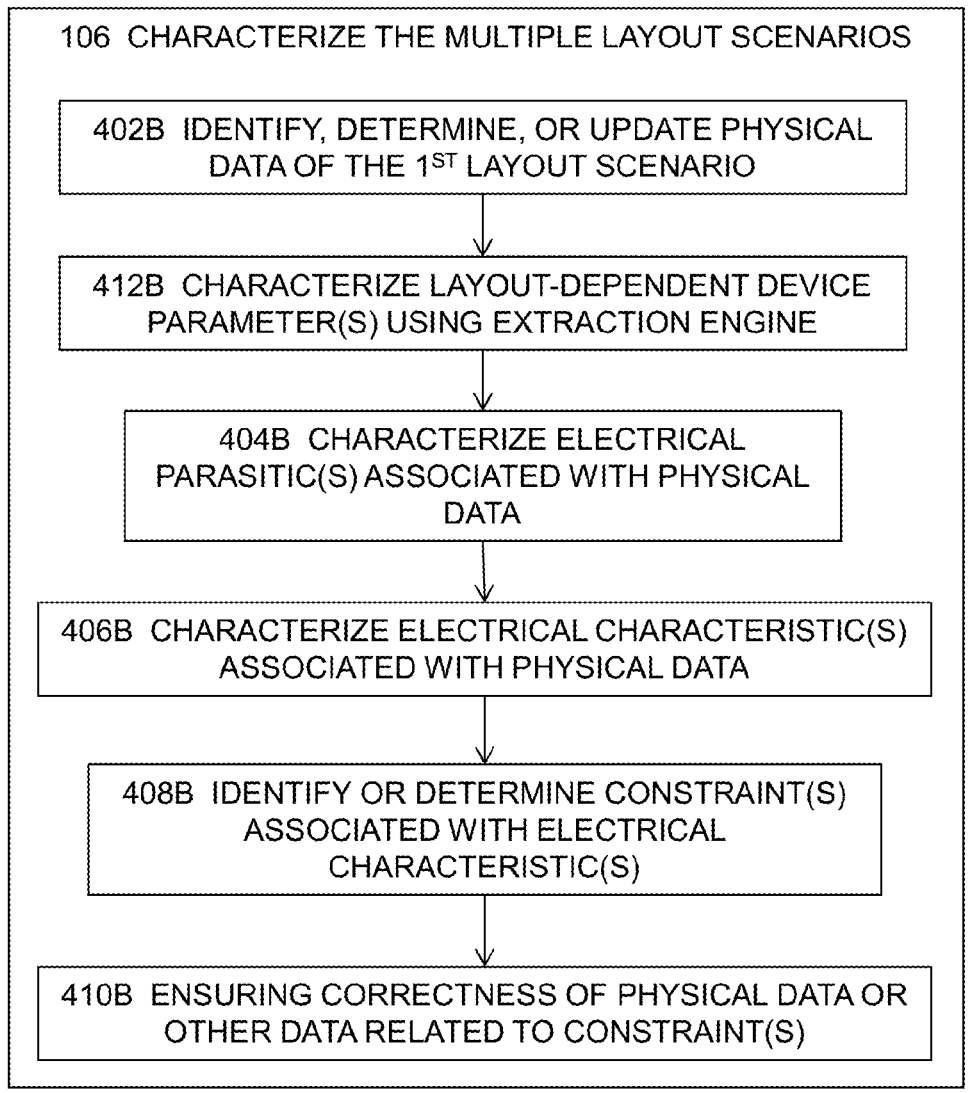
FIG. 4B illustrates more details for a sub-process or sub-module for characterizing the multiple layout scenarios in some embodiments.

FIG. 4B illustrates more details for a sub-process or sub-module for characterizing the multiple layout scenarios in some embodiments. More particularly, FIG. 4B illustrates more details about the process or hardware module 106 characterizing at least one of the multiple, partial layout scenarios in some embodiments. In some embodiments, the process or hardware module 106 may comprise the respective process or hardware module 402B for identifying, determining, or updating physical data of the first layout scenario. The physical data of the first layout scenario may comprise, for example but not limited to, geometric information or data of various shapes in the first layout scenario, respective material properties of various components, thermal properties and operating conditions or requirements of various components, etc.

In some embodiments, the physical data may be related to a net, which comprises one or more wires or interconnects connecting various other components together in an electronic circuit design. In some embodiment, the physical data may be related to a single component in the physical design (e.g., a layout) of the electronic circuit. For example, the method or the system may be applied to determine whether an interconnect segment complies with one or more electromigration related constraints. In this example, the physical data may comprise, for example, the width, the length, the cross-sectional area along the segment, overlap of a metal object and via object etc.

In some embodiments, the physical data may be related to a device, which comprises a component that comprises a source and a drain. A device may comprise, for example, a field-effect transistor. In this example, the physical data may comprise the description of physical device layers and geometric descriptions that define the gate, source and drain regions. In various embodiments, the physical data may further comprise the material and its associated physical (e.g., physical or electrical) attributes. In various embodiments, the method or system may characterize shapes associated with a net and need to determine connectivity to identify one net from another.

In some embodiments, the process for identifying, determining, or updating physical data of the first layout scenario may be invoked from within a physical design tool or flow, such as a layout editor, while the designer is implementing or modifying the physical design of the electronic circuit rather than from a post-layout verification tool or flow. In some embodiments, device recognition and connectivity tasks may be performed to map electrical characteristics such as current at a given terminal with the proper net(s) attached to that terminal. In some embodiments, connectivity may be directed to traverse the nets hierarchically and stop on levels determined by the user. In some embodiments, the drawn geometries of the physical design objects may be combined with manufacturing models to estimate manufactured geometries for those objects or statistical distributions associated with the object. In these embodiments, the as-manufactured geometries may be used with the parasitic models to provide a more accurate estimate of the electrical parasitics, R, L or C.

In some embodiments, the process or hardware module 106 may comprise the respective process or hardware module 412B for characterizing one or more layout-dependent device parameters by using at least an extraction engine, such as a device-level extraction engine.

In these embodiments, device-level extraction engines provide more accurate transistor-level model parameters based at least in part upon the physical data of the devices in a layout context. For example, the layout-dependent device parameters that capture the stress effects caused by the length of oxide (LOD) definition or shallow trench isolation (STI) may be more accurately extracted using the distance of the gate of the transistor from the edge of the channel of the transistor. This length may vary based at least upon the layout context, for example, when a transistor is interdigitated with other transistors to form an interdigitated module. As another example, the layout-dependent device parameters that model the well-proximity effect (WPE) may be more accurately determined using the distance of CMOS (complementary metal-oxide-semiconductor) transistors to an implant well boundary. These device-level extraction engines may leverage detailed information about the physical design of the device shapes in the context of the layout and combine that with manufacturing models to more accurately determine layout-dependent device parameters. These device parameters may be further used to generate transistor-level models that capture the layout-dependent performance of these devices during a circuit simulation.

In some embodiments, the process or hardware module 106 may comprise the respective process or hardware module 404B for characterizing electrical parasitics that are associated with the physical data. In some embodiments, the characterization of electrical parasitics associated with physical data may be performed with a two stage approach.

The two stage approach begins with the selection a particular net or a partial net encompassing the parameterized cell. In the first stage, the approach identifies where along that net or partial net that a geometric description is to be created. The geometric description may include wire widths and spacings, conductor and ILD (inter layer dielectrics) thicknesses, or thickness of barrier materials. A common description may be created and provided via an API (application programming interface.) The second stage may include one or more components that may translate, transform, convert, or map (hereinafter "map") the geometric description to an equivalent parasitic value such as an electrical resistance, capacitance or inductance. This translation, transformation, conversion, or mapping (hereinafter "mapping") may be done with mathematical algorithms or models that are often referred to as parasitic extraction in some embodiments. The models may be created through the use of semi-empirical methods that combine models or knowledge of the underlying physics with data provided by various solver(s), simulator(s), or a combination thereof. In some cases, the mapping for capacitance may also be done with a solver. In some embodiments, the second stage may use parasitic extraction for some nets and a field solver for other nets.

In some embodiments, the second stage may use a combination of parasitic extraction for, for example, resistance(s) and a field solver for, for example, capacitance(s) on the same net. In some embodiments, the characterization of electrical parasitics may be performed with extraction tools that map geometric dimensions and patterns to corresponding parasitics such as R (electrical resistance), L (inductance), and C (capacitance.) In some embodiments, the characterization of electrical parasitics includes the use of field solvers that map geometric dimensions and patterns to capacitance(s).

In some embodiments, the electrical parasitics may comprise, for example, resistance, self-or coupled-inductance, or capacitance that is associated with the physical data. In the previous example of an interconnect segment in a physical design, the method or the system may characterize the electrical resistance of this particular interconnect segment by using the electrical resistivity, the length of the segment, and the cross-sectional area along the segment. In some embodiments the system monitors and tracks the relevant physical data associated with the creation or change to the design, for example the creation of an instance of the parameterized cell. Resistance and capacitance models may be applied automatically to compute the parasitic data in some embodiments. In these embodiments, parasitics may be generated interactively as physical design objects have been or are being created or modified. The set of partial design objects, including a set of one or more objects in the electronic circuit design that is interactively analyzed may form a partial layout. The data is stored for use with subsequent electrical analysis steps and may additionally be displayed in parasitic form.

In some embodiments, the process or hardware module 106 may comprise the respective process or hardware module 406B for characterizing electrical characteristics that are associated with the electrical parasitics or with the physical data. In some embodiments, the parasitic data and a linear solver may be used to solve for, for example, currents and voltages associated with the physical data. For example, the linear solver and parasitic data may be used to solve for all the currents distributed throughout one or more signal nets or the instance of the parameterized cell in the first layout scenario. In this approach, the non-linear devices that are defined as part of a schematic design are generally solved using a circuit simulator. Electrical parameters, for example currents or voltages, associated with the device terminals are stored and provided to the solver. The remaining interconnect portion of the circuit created during layout may be solved as linear system using direct methods, for example Cholesky-based, or iterative, for example Conjugate Gradient, techniques. For example, a linear system could be formed from the following equation:

$$G \cdot \bar{v} = \bar{i},$$

where G is the matrix of conductance values, v is the vector of node voltages and i is the vector of independent sources is solved using a linear solver employing direct or indirect methods. For example, Cholesky factorization may be used to separate the conductance matrix into a product of lower and upper triangular matrices and then forward and back substitution may be used to solve for the voltages throughout the network.

In some embodiments, the process or hardware module 106 may comprise the respective process or hardware module 408B for identifying or determining one or more constraints associated with electrical characteristics. For example, the method or the system may identify or determine an EM (electro-migration) limit that may be associated with or expressed in terms of various types of current or current densities. In some embodiments, the process or hardware module 106 may comprise the respective process or hardware module 4108 for ensuring correctness of the physical data or other data related to the one or more constraints.

In the previous example where the method or the system identifies or determines an EM limit as a constraint, and where the method or the system further determines that at least a part of the physical data does not to meet the EM related constraint, the method or the system may further optionally comprise the process or module of computing or determining one or more adjustments or providing one or more hints to correct the physical data. In some other embodiments, the method or the system may further examine whether another layout scenario with an exactly or approximately identical layout alternative of the parameterized cell may meet the constraint and perform scenario switch, which will be described in greater detail in some subsequent paragraphs, or provides feedback to the designer for the non-compliance with the constraint. In some embodiments, the method or the system may further provide visual indication to the designer on a user interface to show which part of the electronic design does not meet the constraint.

In various embodiments, the characterization of parasitics such as R, L, or C for shapes that constitute a net and the subsequent characterization of the electrical behavior or characteristics such as currents, voltages, or current densities occur as a net (or shape that is part of a net) is created or modified. This characterization may occur incrementally as each net is created or modified and may occur while there is only a partial layout. The simulation produced terminal currents may be used as one or more nets that connect to those terminals are created or modified. For example, the physical data for a wire segment may comprise the material (e.g., Copper, Aluminum, or Tungsten), one or more physical attributes, such as the thermal conductivity, surface boundary activation energy, etc. and/or one or more electrical attributes, such as the electrical conductance, Blech distance, or electrical resistivity.

Figure 4C:
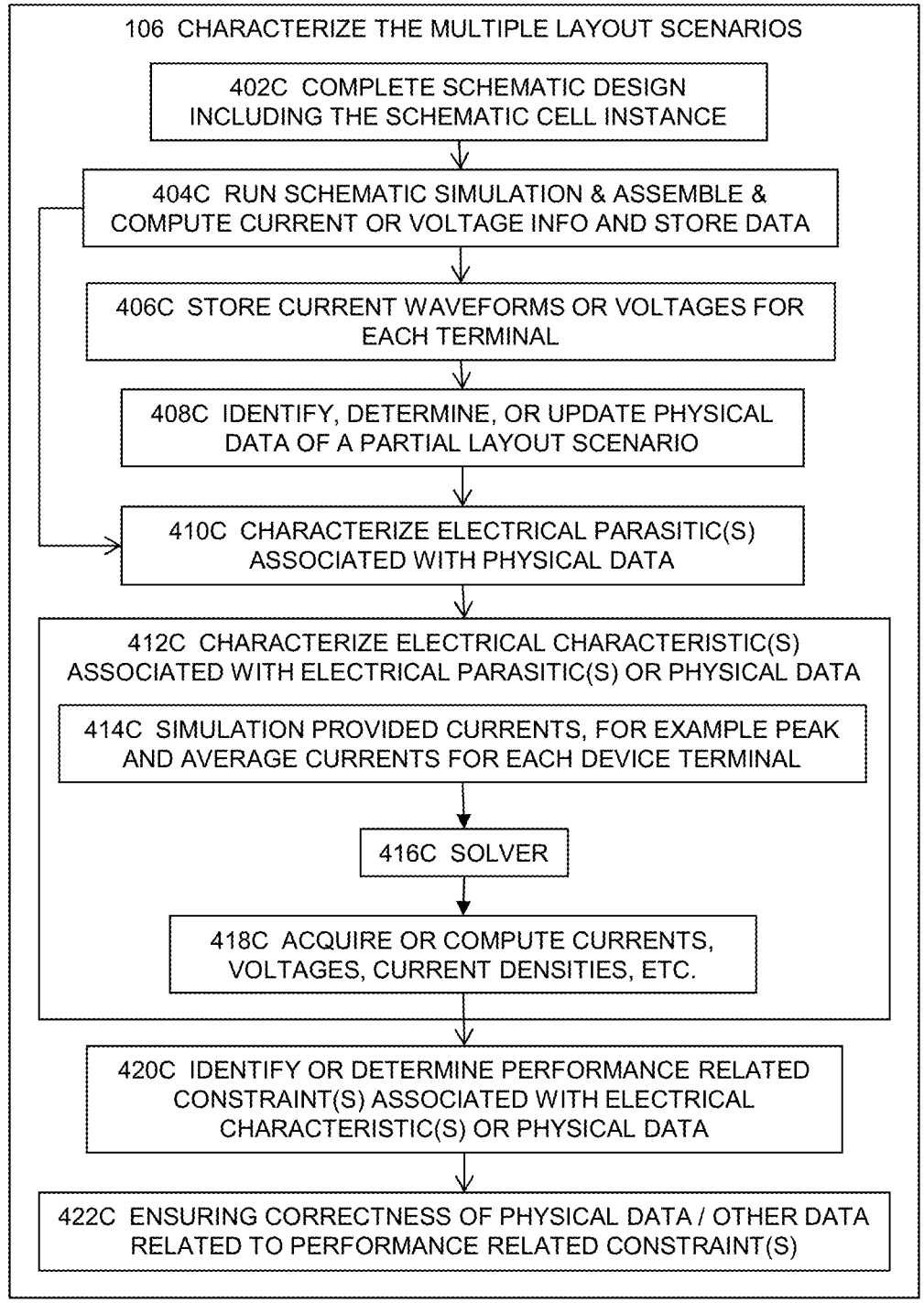
FIG. 4C illustrates more details for a sub-process or sub-module for characterizing the multiple layout scenarios in some embodiments.

FIG. 4C illustrates more details for a sub-process or sub-module for characterizing the multiple layout scenarios in some embodiments. More particularly, FIG. 4C illustrates more details about the process or hardware module 106 of characterizing the multiple layout scenarios in some embodiments. In some embodiments, the process or hardware module 106 of characterizing the multiple layout scenarios may comprise the respective process or hardware module 402C for completing a schematic design or identifying a complete schematic design that includes the schematic cell instance of the parameterized cell.

In some embodiments, the process or hardware module 106 may comprise the respective process or hardware module 404C for performing one or more simulations in the schematic domain and assembling simulation results (e.g., current or voltage information or data). In some embodiments, the process or hardware module 106 may comprise the respective process or hardware module 406C for temporarily or persistently storing the simulation results such as but not limited to, current waveforms or voltages at various nodes or terminals in a non-transitory machine-accessible storage medium.

In some embodiments, the process or hardware module 106 may comprise the respective process or hardware module 408C for identifying, determining, or updating physical data of a layout scenario, which may comprise a complete layout of the entire electronic design or may comprise only a partial, incomplete layout of a portion of the electronic design, in a substantially similar manner as that described with reference to 402B. In some embodiments, the process or hardware module 106 may comprise the respective process or hardware module 410C for characterizing electrical parasitics that are associated with the physical data in a substantially similar manner as that described with reference to 404B.

In some embodiments, the one or more simulations performed in the schematic domain may also be provided directly to the process or hardware module 410 to characterize the electrical parasitics associated with the physical data. In some embodiments, the process or hardware module 106 may comprise the respective process or hardware module 412C for characterizing electrical characteristics that are associated with the electrical parasitics or the physical data. In some embodiments, the process or hardware module 412C may comprise the respective process or hardware module 414C for identifying simulation provided current information or data. In some embodiments, the current information or data comprise, for example, information or data about peak current, RMS (root mean square) current, average current, time-dependent current waveforms, etc.

In some embodiments, the process or hardware module 412C may comprise the respective process or hardware module 416C for using a solver and the current information or data to solve for currents, voltages, current densities, etc. for the first layout scenario at 418C. In some embodiments, the process or hardware module 106 may comprise the respective process or hardware module 420C for identifying or determining one or more performance related constraints that are associated with the electrical parasitics or the physical data. In some embodiments, the process or hardware module 106 may comprise the respective process or hardware module 422C for ensuring the correctness of physical data or other data related to the one or more performance related constraints.

Figure 4D:
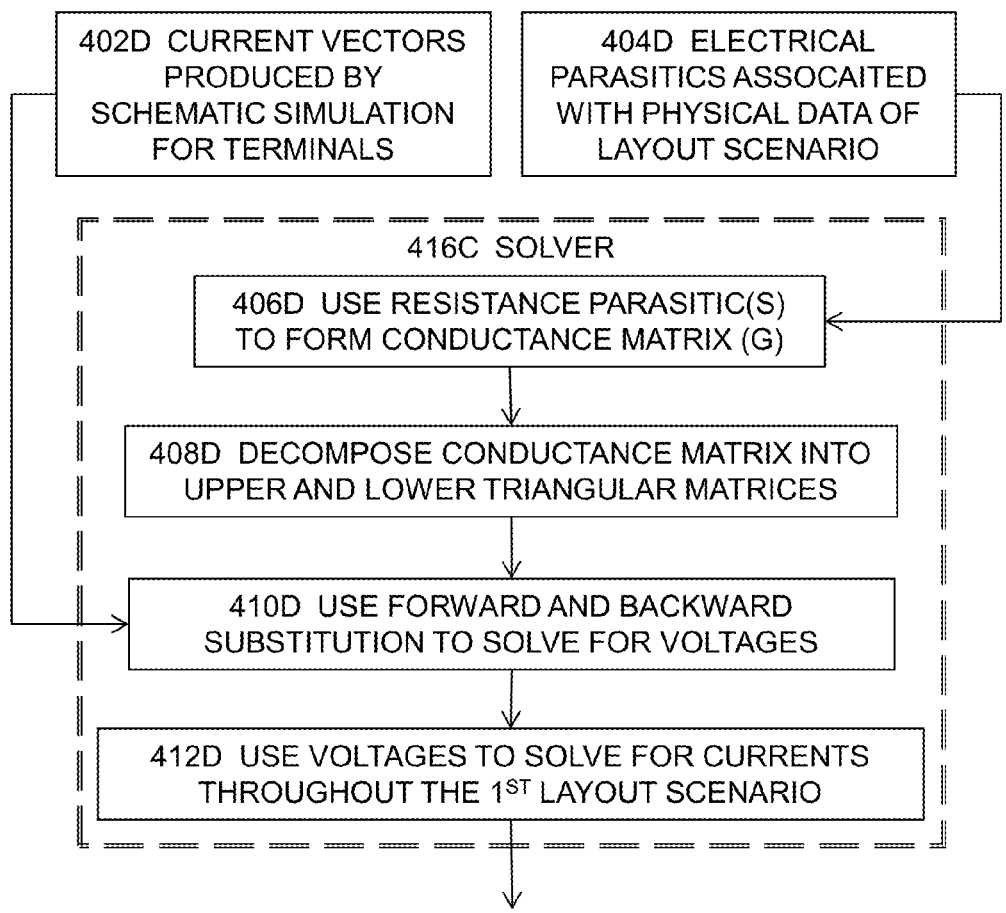
FIG. 4D illustrates more details for a solver to characterize electrical characteristics as well as some exemplary inputs to the solver in some embodiments.

FIG. 4D illustrates more details for a solver to characterize electrical characteristics as well as some exemplary inputs to the solver in some embodiments. More particularly, FIG. 4D illustrates more details about the solver 416C illustrated in FIG. 4C. In some embodiments, the solver may receive electrical parasitics associated with the physical data of the first layout scenario (404D) and may comprise the process for using the resistance parasitics to form a conductance matrix (G) at 406D. The solver may further comprise the process of decomposing the conductance into an upper triangular matrix and a lower triangular matrix at 410D and the process 410D of using forward and backward substitution to solve for various voltages at various nodes, terminals, or pins in the first layout scenario in some embodiments. The solver 416C may further identify current vectors produced by the one or more simulations in the schematic domain (402D) and use the identified current vectors to solve for voltages at 410D in some embodiments. The solver 416C may further comprise the process 412D of using the voltages to solve for currents throughout the first layout scenario in some embodiments.

FIG. 5 illustrates an exemplary data structure for storing various data or information corresponding to multiple layout scenarios in some embodiments. More particularly, FIG. 5 illustrates a scenario parameter table which may be implemented as a database table or other similar structures that support or show relations among various layout scenarios, corresponding extracted views, and one or more corresponding parameters.

The exemplary data structure comprises a plurality of rows, each of which corresponds to a layout scenario that further corresponds to a layout alternative for a parameterized cell of an electronic design. The exemplary data structure further comprises a column entitled "SCP" for a plurality of indices or identifiers, each of which identifies a layout scenario. In some embodiments, each of the plurality of indices or identifiers comprises a database key that uniquely identifies a layout scenario and its corresponding extracted view or one or more parameters.

For example, the row with "SCP" value of "1" includes the "Layout View" "Layout.1" to indicate that the index or identifier "1" may be used to identify the layout scenario "Layout.1". The row for "Layout.1" further includes, for example but not limited to, an "Extracted View" data object "Extracted.1" that corresponds to the layout scenario data object "Layout.1" and one or more "Intrinsic Parameters" (e.g., "<Param1.Name>", "<Param2.Name>", . . . "<ParamN.Name>") and their corresponding values (e.g., "Value1", "Vlaue2", . . . "ValueM") and one or more extrinsic parameters (e.g., "<Param1.Name>", "<Param2.Name>", . . . "<ParamN.Name>") and their corresponding values (e.g., "Value1, Value2, . . . "ValueN".)

Similarly, the exemplary data structure illustrated in FIG. 5 may further comprise one or more additional rows, each of which corresponds to a different layout scenario as identified in the "Layout View" column and other data, data objects, or values in some embodiments. In addition or in the alternative, the exemplary data structure illustrated in FIG. 5 may further include a column to identify a layout alternative that corresponds to one or more layout scenarios to encompass the embodiments where a single layout alternative of a parameterized cell may be placed in multiple layout scenarios with different contexts. In some embodiments, some of the entities in the exemplary data structure may be implemented in the form of a data object. In some embodiments, some of the entities may be implemented in a form of a symbolic representation and reside in their respective fields in the exemplary data structure, and each of the respective fields may be further associated with a link or pointer that links to or points to the actual data which may be stored separately from the exemplary data structure.

Figure 6:
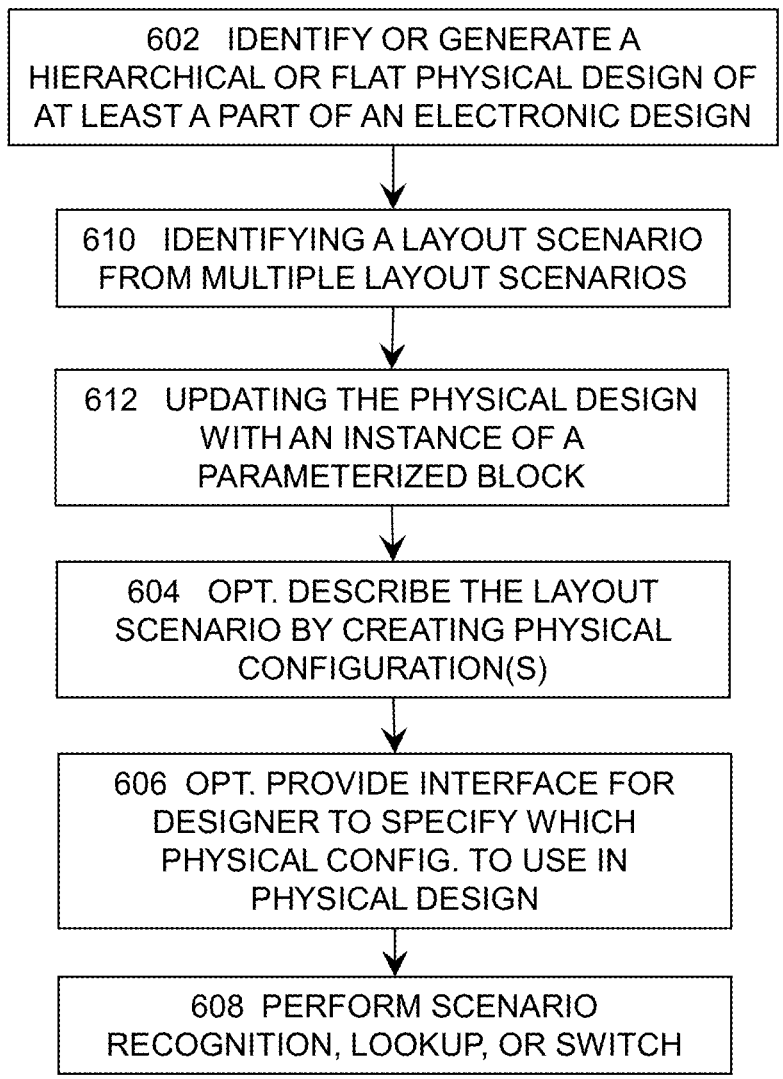
FIG. 6 illustrates a high level flow diagram for implementing an electronic design by using multi-scenario physically-aware design methodology in some embodiments.

FIG. 6 illustrates a high level flow diagram of a method or system for implementing an electronic design by using multi-scenario physically-aware design methodology in some embodiments. In one or more embodiments, the method or the system for implementing an electronic design by using multi-scenario physically-aware design methodology may invoke at least one processor or at least one processor core of a computing system and comprise the respective process or hardware module 602 of identifying or generating a hierarchical of a flat physical design of at least a part of an electronic design.

In some embodiments, the method or the system may further comprise the respective process or hardware module 610 to coordinate with the processor or the processor core to identify a layout scenario including one or more instances of a parameterized cell from multiple layout scenarios at 610. In some embodiments, the method or the system may generate at least some of the multiple layout scenarios on the fly or on demand at 610. In some embodiments, the method or the system or another substantially similar method or another system may generate these multiple layout scenarios in advance at 610 and store these generated multiple layout scenarios either temporarily or persistently for future use.

In some embodiments, the method or the system may further comprise the respective process or hardware module 612 for updating the physical design with one or more instances of the parameterized block. For example, the method or the system may update the physical design by placing one or more layout alternatives for the parameterized cell in the physical design in some embodiments. In some embodiments, the method or the system may further perform at least partial routing for the layout scenario.

For example, the method or the system may perform internal routing for the layout scenario in some implementations. In some embodiments, the method or the system may further optionally comprise the respective process or hardware module 604 for describing the layout scenario by creating one or more physical configurations. In some embodiments, a physical configuration may be used to specify layout scenario instance or to describe which scenario instance is selected for a particular physical design. In some embodiments, the method or the system may further optionally comprise the respective process or hardware module 606 that provides a user interface that allows a designer to specify which physical configuration or which layout scenario is to be used in the physical design. In some embodiments, the method or the system may further comprise the respective process or hardware module 608 for performing scenario recognition, scenario lookup, or scenario switch.

Figure 7:
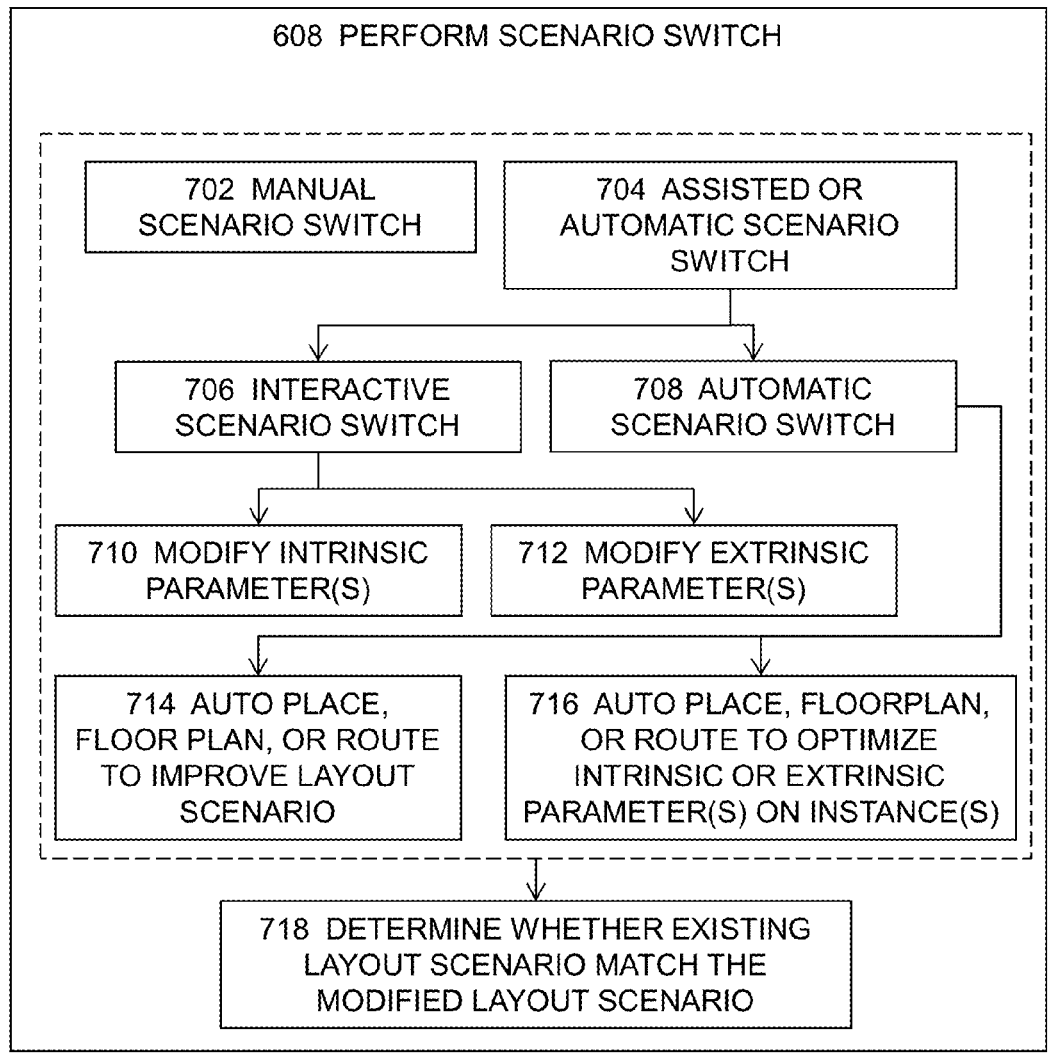
FIG. 7 illustrates more details for a part of the high level flow diagram for implementing an electronic design by using multi-scenario physically-aware design methodology illustrated in FIG. 6 in some embodiments.

FIG. 7 illustrates more details for a part of the high level flow diagram for implementing an electronic design by using multi-scenario physically-aware design methodology illustrated in FIG. 6 in some embodiments. More particularly, FIG. 7 illustrates more details about the flow for performing scenario recognition, scenario lookup, or scenario switch in some embodiments. In one or more embodiments, the method or the system may utilize a computing system having at least one processor or at least one processor core to perform the process 608 or to coordinate with the hardware module 608 to perform either a manual scenario switch 702 where a designer manually replaces a layout scenario with another, an assisted or automatic scenario switch 704, or a combination of manual and assisted or automatic scenario switch.

In some embodiments, the process or hardware module 704 for performing the assisted or automatic scenario switch may comprise the respective process or hardware module 706 for performing interactive scenario switch. In some embodiments, the process or hardware module 706 for interactive scenario switch may comprise the respective process or module 710 for modifying one or more intrinsic parameters or the respective process or module 712 for modifying one or more extrinsic parameters. In some embodiments, the process or hardware module 704 for performing the assisted or automatic scenario switch may comprise the respective process or module 714 for performing placement, floorplanning, or routing to improve the layout scenario. In some embodiments, the process or hardware module 704 for performing the assisted or automatic scenario switch may comprise the respective process or module 716 for performing placement, floorplanning, or routing to optimize one or more intrinsic or one or more extrinsic parameters for one or more instances of the parameterized cell.

Figure 8:
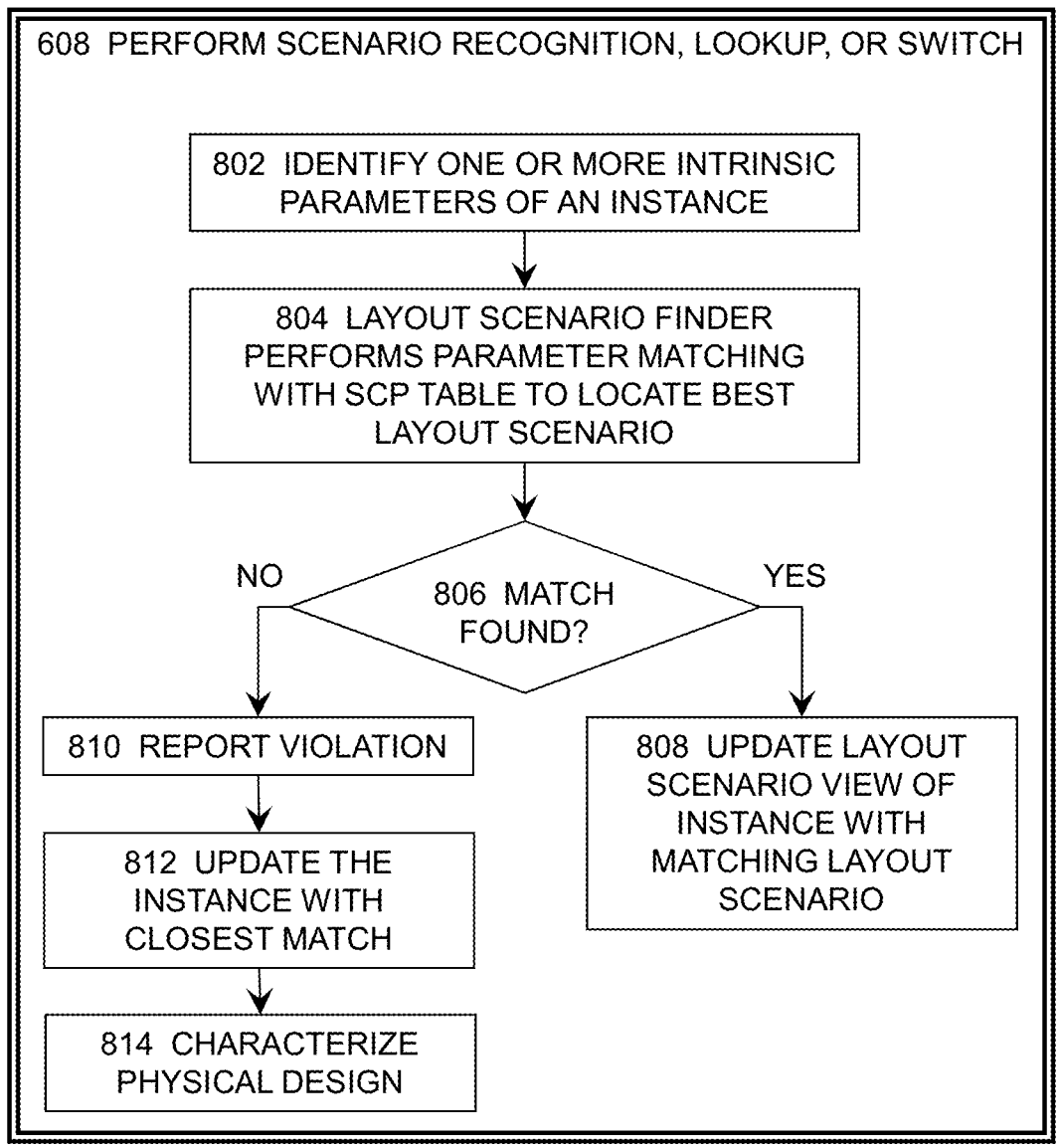
FIG. 8 illustrates more details for a part of the high level flow diagram for implementing an electronic design by using multi-scenario physically-aware design methodology illustrated in FIG. 6 in some embodiments.

FIG. 8 illustrates more details for a part of the high level flow diagram for implementing an electronic design by using multi-scenario physically-aware design methodology illustrated in FIG. 6 in some embodiments. More particularly, FIG. 8 illustrates more details about the process or hardware module 608 for performing scenario recognition, scenario lookup, or scenario switch in some embodiments. In one or more embodiments, the process or module 608 for performing scenario recognition, scenario lookup, or scenario switch may coordinate a computing system and comprise the respective process or hardware module 802 for identifying one or more intrinsic parameters.

In some embodiments, the process or module 608 may further comprise the respective process or module 804 for matching the one or more intrinsic parameters with one or more parameters in a scenario table by using a layout scenario finder to identify or determine a layout scenario whose corresponding parameters exactly or approximately matches the one or more intrinsic parameters identified at 802. In some embodiments where multiple layout scenarios are identified or determined to exactly or approximately match one or more intrinsic parameters, the method or the system may determine a matching score for these multiple layout scenarios based on the variance of the corresponding parameters of each of the multiple layout scenarios from the one or more intrinsic parameters and identify the layout scenario with a better matching score as the target layout scenario.

In some embodiments where more than one layout scenarios have the same matching score, the method or the system may further assign weights to the parameters to be matched based at least in part upon, for example, intended purpose of the design, designer's intent, etc. and re-calculate the matching scores based on the weights. In some embodiments, the process or module 608 may further comprise the respective process or module 806 for determining whether a matching layout scenario has been identified. In some embodiments, the process or module 608 may determine that a matching layout scenario is identified if the corresponding parameters of the matching layout scenario exactly match the one or more intrinsic parameters.

In some embodiments, the process or module 608 may determine that a matching layout scenario is identified if the corresponding parameters of the matching layout scenario approximately match the one or more intrinsic parameters based at least in part upon some matching criteria. In some embodiments, the matching criteria comprise variance between an intrinsic parameter of a layout scenario instance or view and a corresponding parameter of a layout scenario from, for example, a scenario table. For example, the method or the system may first determine a threshold value beyond which a variance is not acceptable. The threshold value may comprise an absolute value or a relative value such as in a percentage form.

In some embodiments where the process or hardware module 806 determines that a matching layout scenario has been identified, the method or the system may further comprise the respective process or hardware module 808 for updating the layout scenario view of an instance of the parameterized cell with the matching layout scenario. In some embodiments where the process or hardware module 806 determines that a matching layout scenario has not been identified from the existing layout scenarios, and no approximately matching layout scenario could be built by varying the parameters, the method or the system may further comprise the respective process or hardware module 810 for reporting a violation for layout scenario recognition.

In some of these embodiments where a closer match is identified but does not meet the matching criteria, the process or module 608 may comprise the respective process or hardware module 812 for updating the instance with this closer match of layout scenario by using a scenario updater. In some of these embodiments where a layout switch has been performed, the process or module 608 may comprise the respective process or hardware module 814 for characterizing the physical design or a portion thereof with the layout scenario after the layout scenario switch. In some embodiments where the process or module 608 identifies an approximate matching layout scenario that does not exactly match what is in the physical design, the method or the system may use the scenario updater to update, for example, the CDF (component description format) parameters of the approximate matching layout scenario in the scenario table.

Figure 9:
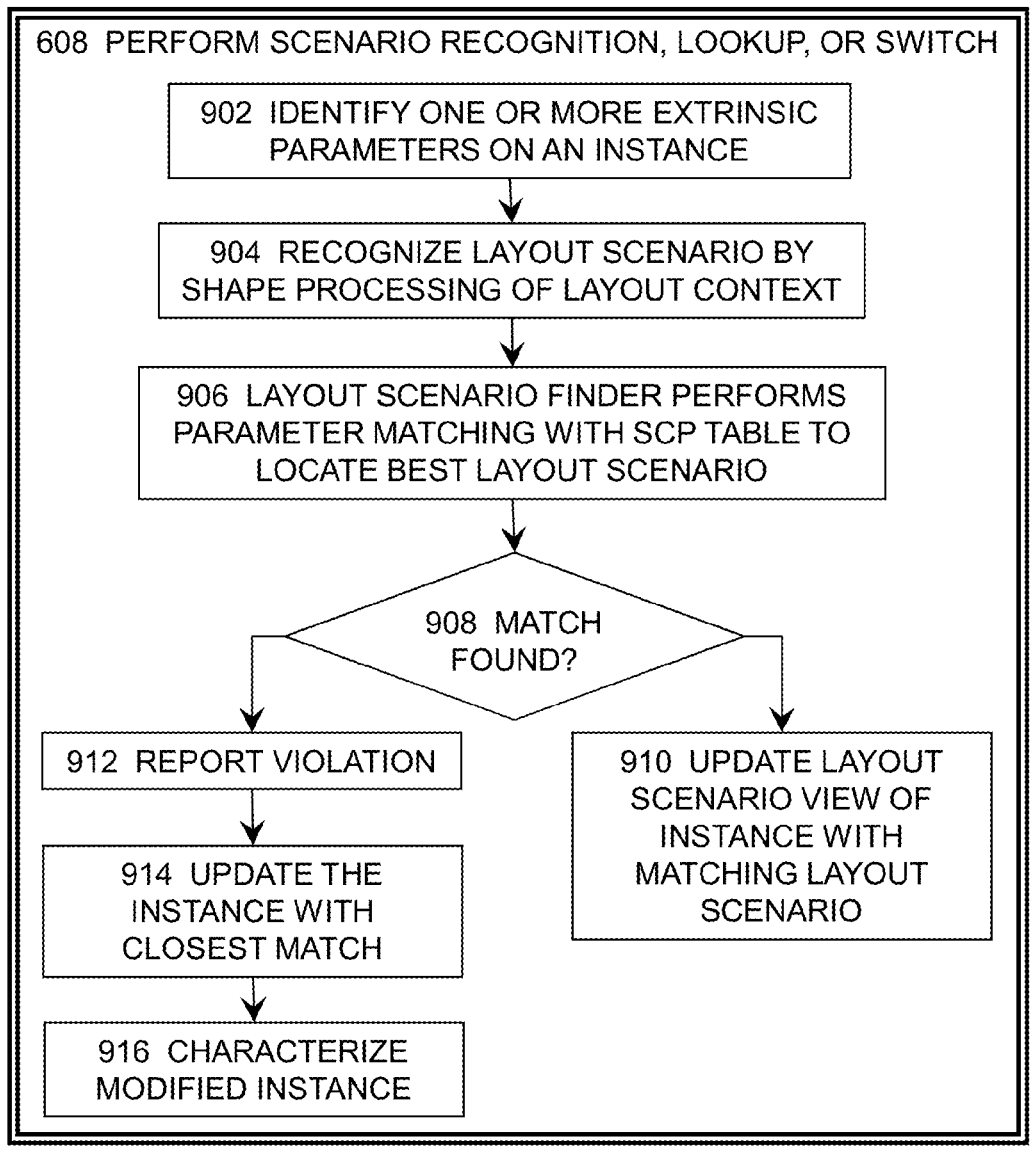
FIG. 9 illustrates more details for a part of the high level flow diagram for implementing an electronic design by using multi-scenario physically-aware design methodology illustrated in FIG. 6 in some embodiments.

FIG. 9 illustrates more details for a part of the high level flow diagram for implementing an electronic design by using multi-scenario physically-aware design methodology illustrated in FIG. 6 in some embodiments. More particularly, FIG. 9 illustrates more details about the process or hardware module 608 for performing scenario recognition, scenario lookup, or scenario switch in some embodiments. In one or more embodiments, the process or module 608 for performing scenario recognition, scenario lookup, or scenario switch may coordinate a computing system and comprise the respective process or hardware module 902 for identifying one or more extrinsic parameters.

In some embodiments, the process or module 608 may further comprise the respective process or module 904 for recognizing the layout scenario by performing shape processing for various shapes in the physical design in a layout context. In some embodiments, the process or module 608 may further comprise the respective process or module 906 for matching the one or more extrinsic parameters with one or more parameters in a scenario table by using a layout scenario finder to identify or determine a layout scenario whose corresponding parameters exactly or approximately matches the one or more extrinsic parameters identified at 902.

In some embodiments where multiple layout scenarios are identified or determined to exactly or approximately match one or more extrinsic parameters, the method or the system may determine a matching score for these multiple layout scenarios based at least in part on the variance of the corresponding parameters of each of the multiple layout scenarios from the one or more extrinsic parameters and identify the layout scenario with a better matching score as the target layout scenario for scenario recognition, scenario lookup, or scenario switch. In some embodiments where more than one layout scenarios have the same matching score, the method or the system may further assign weights to the parameters to be matched based at least in part upon, for example, intended purpose of the design, designer's intent, etc. and re-calculate the matching scores based on the weights.

In some embodiments, the process or module 608 may further comprise the respective process or module 908 for determining whether a matching layout scenario has been identified. In some embodiments, the process or module 608 may determine that a matching layout scenario is identified if the corresponding parameters of the matching layout scenario exactly match the one or more extrinsic parameters. In some embodiments, the process or module 608 may determine that a matching layout scenario is identified if the corresponding parameters of the matching layout scenario approximately match the one or more extrinsic parameters based at least in part upon some matching criteria.

In some embodiments, the matching criteria comprise variance between an extrinsic parameter of a layout scenario instance or view and a corresponding parameter of a layout scenario from, for example, a scenario table. For example, the method or the system may first determine a threshold value beyond which a variance is not acceptable. The threshold value may comprise an absolute value or a relative value such as in a percentage form. In some embodiments where the process or hardware module 908 determines that a matching layout scenario has been identified, the method or the system may further comprise the respective process or hardware module 910 for updating the layout scenario view of an instance of the parameterized cell with the matching layout scenario.

In some embodiments where the process or hardware module 908 determines that a matching layout scenario has not been identified from the existing layout scenarios, and no approximately matching layout scenario could be built by varying the parameters, the method or the system may further comprise the respective process or hardware module 912 for reporting a violation for layout scenario recognition. In some of these embodiments where a closer match is identified but does not meet the matching criteria, the process or module 608 may comprise the respective process or hardware module 914 for updating the instance with this closer match of layout scenario by using a scenario updater.

In some of these embodiments where a layout switch has been performed, the process or module 608 may comprise the respective process or hardware module 916 for characterizing the physical design or a portion thereof with the layout scenario after the layout scenario switch. In some embodiments where the process or module 608 identifies an approximate matching layout scenario that does not exactly match what is in the physical design, the method or the system may use the scenario updater to update, for example, the CDF (component description format) parameters of the approximate matching layout scenario in the scenario table.

Figure 10:
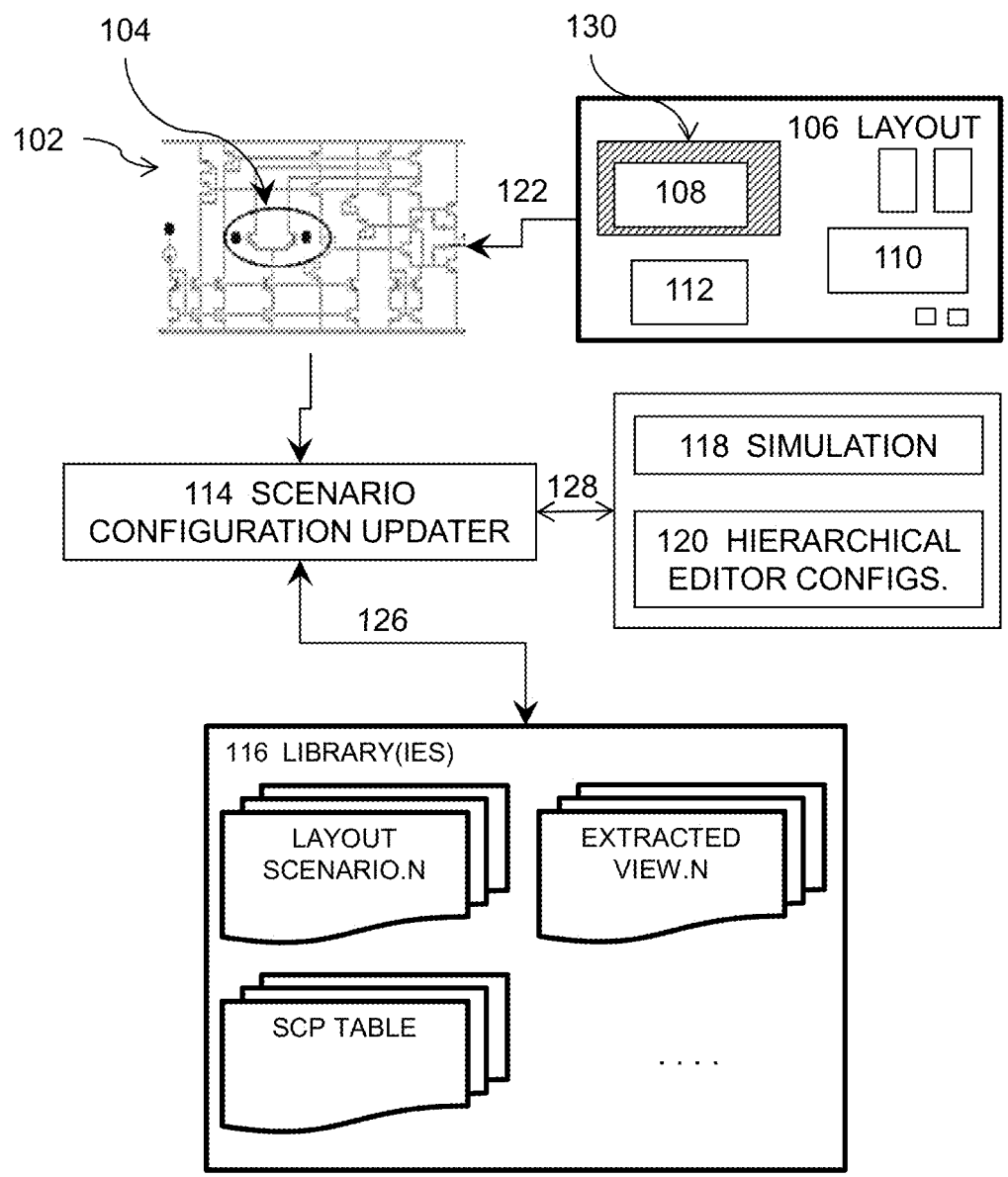
FIG. 10 illustrates a high level flow diagram for evaluating layout dependent effects in an electronic design by using multi-scenario physically-aware design methodology in some embodiments.

FIG. 10 illustrates a high level flow diagram for evaluating layout dependent effects in an electronic design by using multi-scenario physically-aware design methodology in some embodiments. FIG. 10 illustrates various ways that a designer may analyze the impact of layout-dependent effects on the performance of a schematic electronic circuit during simulation. More specifically, FIG. 10 illustrates the use of a computing system to handle a schematic design (102) of an electronic circuit that comprises a schematic instance of a parameterized cell 104 of a critical component that corresponds to the instance 108 in the physical design 106.

FIG. 10 further illustrates that layout analysis may also be optionally performed on a corresponding physical design 106 of the schematic design (102), where the physical design 106 includes a first instance (108) of the parameterized cell within a first layout context (130), a second instance (112) of the same parameterized cell within the same or a different layout context (not shown), and a third instance (110) of another parameterized cell. The physical design 106 may include various components other than the instance 108 if the method or the system determines that the presence of such various components may affect the performance of the instance 106 of the parameterized cell in some embodiments.

In some embodiments, the layout analysis may be performed by simulating the layout 106 in the physical domain. The method or the system may further pass various parameter values, data, or information from the physical domain to the schematic domain via 122 and back-annotate or stitch such various parameter values, data, or information to the schematic design in some embodiments. The method or the system may further invoke a scenario configuration updater 114 that may create a hierarchical editor (HED) configuration (120) or simulation results 118 in the schematic domain via 128 to use a pre-characterized extracted views (116) of the physical design based at least in part upon a scenario lookup process on a scenario table (116) via 126. One of the advantages of this exemplary embodiment is that the method or the system may stitch a plurality of portions of multiple extracted views from a scenario table and then quickly estimate the performance of the entire electronic circuit during the schematic design stage or the physical design stage without performing the resource intensive tasks of re-extracting the entire physical design.

System Architecture Overview

Figure 11:
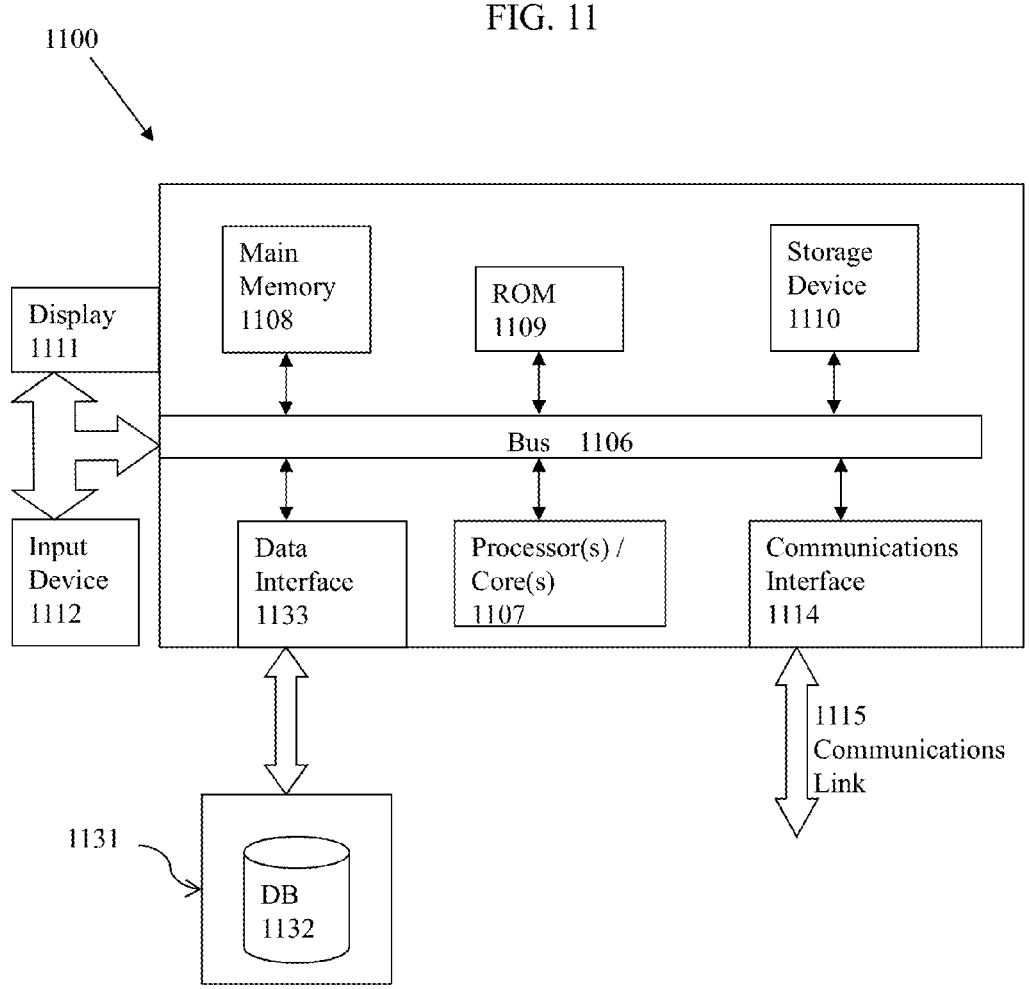
FIG. 11 depicts a computerized system on which a method for timing closure with concurrent process models may be implemented.

FIG. 11 illustrates a block diagram of an illustrative computing system 1100 suitable for implementing some embodiments of the method or system for implementing electronic circuit designs with electro-migration awareness as described in the preceding paragraphs with reference to various figures. Computer system 1100 includes a bus 1106 or other communication mechanism for communicating information, which interconnects subsystems and devices, such as processor 1107, system memory 1108 (e.g., RAM), static storage device 1109 (e.g., ROM), disk drive 1110 (e.g., magnetic or optical), communication interface 1114 (e.g., modem or Ethernet card), display 1111 (e.g., CRT or LCD), input device 1112 (e.g., keyboard), and cursor control (not shown).

According to one embodiment, computer system 1100 performs specific operations by one or more processor or processor cores 1107 executing one or more sequences of one or more instructions contained in system memory 1108. Such instructions may be read into system memory 1108 from another computer readable/usable storage medium, such as static storage device 1109 or disk drive 1110. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 1107, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof. In one embodiment, the parasitic extraction, current solving, current density computation and current or current density verification is done in memory as layout shapes or nets are created or modified.

The term "computer readable storage medium" or "computer usable storage medium" as used herein refers to any medium that participates in providing instructions to processor 1107 for execution. Such a medium may take many forms, including but not limited to, non-volatile media and volatile media. Non-volatile media includes, for example, optical or magnetic disks, such as disk drive 1110. Volatile media includes dynamic memory, such as system memory 1108.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1100. According to other embodiments of the invention, two or more computer systems 1100 coupled by communication link 1115 (e.g., LAN, PTSN, or wireless network) may perform the sequence of instructions required to practice the invention in coordination with one another.

Computer system 1100 may transmit and receive messages, data, and instructions, including program, i.e., application code, through communication link 1115 and communication interface 1114. Received program code may be executed by processor 1107 as it is received, and/or stored in disk drive 1110, or other non-volatile storage for later execution. In an embodiment, the computer system 1100 operates in conjunction with a data storage system 1131, e.g., a data storage system 1131 that contains a database 1132 that is readily accessible by the computer system 1100. The computer system 1100 communicates with the data storage system 1131 through a data interface 1133. A data interface 1133, which is coupled to the bus 1106, transmits and receives electrical, electromagnetic or optical signals that include data streams representing various types of signal information, e.g., instructions, messages and data. In embodiments of the invention, the functions of the data interface 1133 may be performed by the communication interface 1114.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for implementing multi-scenario physically-aware design of an electronic circuit design, comprising:
using at least one processor or at least one processor core to perform a process the process comprising:

identifying or creating multiple layout alternatives for a parameterized cell of the electronic circuit design;

generating multiple layout scenarios, at least one of which constitutes a first partial, incomplete layout, using at least some of the multiple layout alternatives in multiple contexts for the parameterized cell; and characterizing at least the first partial, incomplete layout in the multiple layout scenarios.

2. The computer implemented method of claim 1, the action of identifying or creating the multiple layout alternatives for the parameterized cell comprising:

identifying or receiving an input comprising a device parameter and a parameterized cell parameter for the parameterized cell, in which the device parameter corresponds to multiple device parameter values, and the parameterized cell parameter corresponds to multiple block parameter values.

3. The computer implemented method of claim 1, in which the multiple layout alternatives comprise at least one partial, incomplete layout of electronic circuit design.

4. The computer implemented method of claim 3, the partial, incomplete layout of electronic circuit design contains a single net that includes an instance of the parameterized cell.

5. The computer implemented method of claim 1, the process further comprising:

identifying a context for an instance of the parameterized cell in the electronic circuit design; and selecting a layout alternative from the multiple layout alternative for the instance of the parameterized cell for the context.

6. The computer implemented method of claim 1, wherein the act of identifying or creating the multiple layout alternatives comprises:

identifying a device parameter value for a device parameter of the parameterized cell;

identifying or determining a block parameter value for a block parameter of the parameterized cell; and identifying or determining an inter-component or an inter-device constraint for the parameterized cell.

7. The computer implemented method of claim 1, wherein the act of identifying or determining the block parameter value comprises at least one of:

identifying or determining a dummy device that is included in or with the parameterized cell in one of the multiple layout alternatives;

identifying or determining an additional component to be included in or with the parameterized cell in one of the multiple layout alternatives;

adjusting a location or an orientation of a component that is included in or with the parameterized cell in one of the multiple layout alternatives; and identifying or determining a pattern of one or more components that are included in or with the parameterized cell.

8. The computer implemented method of claim 7, wherein the action of adjusting the location or the orientation of the component comprises at least one of:

aligning the component with one or more other components in the electronic circuit design; and determining a custom spacing between the component and another component in the electronic circuit design.

9. The computer implemented method of claim 1, wherein the act of generating the multiple layout scenarios comprises:

performing placement for a layout alternative of the multiple layout alternatives in a context of the multiple contexts;

performing partial routing for the parameterized cell to create an interconnect based at least in part upon the placement for the layout alternative; and creating a layout scenario of the multiple layout scenarios based at least in part upon the placement and the partial routing.

10. The computer implemented method of claim 1, in which the act of characterizing the each of the multiple layout scenarios comprises:

identifying a first layout scenario corresponding to a first set of scenario parameters and a first view of first layout scenario;

identifying a first extracted view of the first layout scenario based at least in part upon the first set of parameters;

capturing an intrinsic parameter for the parameterized cell based at least in part upon the first extracted view; and capturing an extrinsic parameter for the parameterized cell based at least in part upon the first extracted view.

11. The computer implemented method of claim 1, in which the act of characterizing the each of the multiple layout scenarios comprises:

identifying, determining, or updating physical data of the first layout scenario;

characterizing a layout-dependent device parameter using an extraction engine;

characterizing an electrical parasitic associated with the physical data;

characterizing an electrical characteristic associated with the electrical parasitic or the physical data;

identifying or determining a constraint associated with the electrical characteristic; and ensuring correctness of the physical data or other physical data related to the constraint.

12. The computer implemented method of claim 11, the act of characterizing the each of the multiple layout scenarios further comprising:

performing a schematic simulation for the electronic circuit design;

assembling at least current or voltage information based at least in part upon a result of the schematic simulation; and determining the electrical characteristic in a physical domain by using a solver.

13. The computer implemented method of claim 12, the action of determining the electrical characteristic in the physical domain by using the solver comprising:

forming a matrix by using at least the electrical parasitic;

determining a first electrical characteristic by using at least the matrix; and determining the electrical characteristic by using at least the first electrical characteristic.

14. The computer implemented method of claim 1, the process further comprising:

identifying a plurality of layout scenarios of the electronic circuit design;

identifying a plurality of extracted views of the plurality of layout scenarios from a scenario table based at least in part upon one or more sets of scenario parameters; and evaluating a performance of the electronic circuit design by using at least the plurality of extracted views.

15. The computer implemented method of claim 1, the action of evaluating the performance of the electronic circuit design comprising:

stitching at least a portion of each of the plurality of extracted views, wherein the action of evaluating the performance of the electronic circuit in its entirety is performed without requiring performance of extraction on the electronic circuit, and the action of evaluating the performance is used to estimate the performance of the electronic circuit in its entirety at a schematic design stage or at a layout design stage.

16. A computer implemented method for implementing multi-scenario physically-aware design of an electronic design, comprising:

using at least one processor or at least one processor core to perform a process the process comprising:

identifying or generating a physical design of at least a part of the electronic design;

identifying a layout scenario from multiple layout scenarios, the layout scenario being a partial, incomplete layout and comprising a parameterized cell;

updating the physical design by using a first instance of the parameterized cell in the layout scenario; and performing at least one of scenario recognition, scenario lookup, and scenario switch.

17. The computer implemented method of claim 16, the process further comprising at least one of:

describing the first layout scenario by creating a physical configuration for the first layout scenario; and receiving identification for the first layout scenario from a user.

18. The computer implemented method of claim 16, in which the action of performing the scenario switch comprises at least one of:

performing automatic scenario switch without requiring human intervention; and performing assisted scenario switch by interacting with a user to provide the user with an option to modify an intrinsic parameter or an extrinsic parameter of the parameterized cell.

19. The computer implemented method of claim 16, in which the action of performing the automatic scenario switch comprises at least one of:

performing automatic placement, floorplanning, or routing to improve a cellview of at least a part of the first layout scenario; and performing automatic placement, floorplanning, or routing to improve an intrinsic parameter or an extrinsic parameter for the first instance of the parameterized cell.

20. The computer implemented method of claim 16, in which the action of performing the scenario recognition or the scenario lookup comprises at least one of:

identifying an intrinsic parameter or an extrinsic parameter for the first instance;

determining whether the intrinsic parameter or the extrinsic parameter for the first instance matches with a first parameter of a first layout scenario in a data structure; and updating the physical design with the first layout scenario, wherein the first parameter of the first layout scenario is determined to match with the intrinsic parameter or the extrinsic parameter.

21. The computer implemented method of claim 20, in which the action of performing the scenario recognition or the scenario lookup further comprises:

updating the physical design with a second layout scenario, wherein the first parameter of the first layout scenario is determined not to match with the intrinsic parameter or the extrinsic parameter, and a second parameter of the second layout scenario is determined to be a closest match with the intrinsic parameter or the extrinsic parameter.

22. The computer implemented method of claim 21, in which the action of performing the scenario recognition or the scenario lookup further comprises at least one of:

characterizing the physical design based at least in part upon the second layout scenario; and reporting a layout switch violation, wherein the first parameter of the first layout scenario is determined not to match with the intrinsic parameter or the extrinsic parameter, and a second parameter of the second layout scenario is determined to be a closest match with the intrinsic parameter or the extrinsic parameter.

23. A system for implementing multi-scenario physically-aware design of an electronic circuit design, comprising:

at least one processor or at least one processor core that is to:

identify or create multiple layout alternatives for a parameterized cell of the electronic circuit design;

generate multiple layout scenarios, at least one of which constitutes a first partial, incomplete layout, using at least some of the multiple layout alternatives in multiple contexts for the parameterized cell; and characterize at least the first partial, incomplete layout in the multiple layout scenarios.

24. The system of claim 23, the at least one processor or at least one processor core is further to:

identify a context for an instance of the parameterized cell in the electronic circuit design; and select a layout alternative from the multiple layout alternative for the instance of the parameterized cell for the context.

25. The system of claim 23, in which the at least one processor or at least one processor core to identify or create the multiple layout alternatives is further to:

identify a device parameter value for a device parameter of the parameterized cell;

identify or determine a block parameter value for a block parameter of the parameterized cell; and identify or determine an inter-component or an inter-device constraint for the parameterized cell.

26. The system of claim 23, in which the at least one processor or at least one processor core to identify or determine the block parameter value is further to perform at least one of:

identifying or determining a dummy device that is included in or with the parameterized cell in one of the multiple layout alternatives;

identifying or determining an additional component to be included in or with the parameterized cell in one of the multiple layout alternatives;

adjusting a location or an orientation of a component that is included in or with the parameterized cell in one of the multiple layout alternatives, wherein the at least one processor or the at least one processor core to adjust the location or the orientation of the component is further to perform at least one of:

aligning the component with one or more other components in the electronic circuit design; and determining a custom spacing between the component and another component in the electronic circuit design; and identifying or determining a pattern of one or more components that are included in or with the parameterized cell.

27. The system of claim 23, in which the at least one processor or the at least one processor core to characterize the each of the multiple layout scenarios is further to:
- identify, determine, or update physical data of the first layout scenario;
- characterize an electrical parasitic associated with the physical data;
- characterize an electrical characteristic associated with the electrical parasitic or the physical data;
- identify or determine a constraint associated with the electrical characteristic; and
- ensure correctness of the physical data or other physical data related to the constraint.

28. The system of claim 27, in which the at least one processor or the at least one processor core to characterize the each of the multiple layout scenarios is further to:
- perform a schematic simulation for the electronic circuit design;
- assemble at least current or voltage information based at least in part upon a result of the schematic simulation; and
- determine the electrical characteristic in a physical domain by using a solver, wherein the action of determining the electrical characteristic in the physical domain by using the solver comprising:
  - form a matrix by using at least the electrical parasitic;
  - determine a first electrical characteristic by using at least the matrix; and
  - determine the electrical characteristic by using at least the first electrical characteristic.

29. An article of manufacture comprising a non-transitory computer readable storage medium having a sequence of instructions stored thereupon which, when executed by at least one processor or at least one processor core, causes the at least one processor or the at least one processor core to perform a method for implementing multi-scenario physically-aware design of an electronic circuit design, the method comprising:
- using at least one processor or at least one processor core to perform a process the process comprising:
- identifying or creating multiple layout alternatives for a parameterized cell of the electronic circuit design;
- generating multiple layout scenarios, at least one of which constitutes a first partial, incomplete layout, using at least some of the multiple layout alternatives in multiple contexts for the parameterized cell; and
- characterizing at least the first partial, incomplete layout in the multiple layout scenarios.

30. The article of manufacture of claim 29, the process further comprising:
- identifying a context for an instance of the parameterized cell in the electronic circuit design; and
- selecting a layout alternative from the multiple layout alternative for the instance of the parameterized cell for the context.

31. The article of manufacture of claim 27, wherein the act of identifying or creating the multiple layout alternatives comprises:
- identifying a device parameter value for a device parameter of the parameterized cell;
- identifying or determining a block parameter value for a block parameter of the parameterized cell; and
- identifying or determining an inter-component or an inter-device constraint for the parameterized cell.

32. The article of manufacture of claim 29, wherein the act of identifying or determining the block parameter value comprises at least one of:
- identifying or determining a dummy device that is included in or with the parameterized cell in one of the multiple layout alternatives;
- identifying or determining an additional component to be included in or with the parameterized cell in one of the multiple layout alternatives;
- adjusting a location or an orientation of a component that is included in or with the parameterized cell in one of the multiple layout alternatives, wherein the action of adjusting the location or the orientation of the component comprises at least one of:
  - aligning the component with one or more other components in the electronic circuit design; and
  - determining a custom spacing between the component and another component in the electronic circuit design; and
- identifying or determining a pattern of one or more components that are included in or with the parameterized cell.

33. The article of manufacture of claim 29, in which the action of characterizing the each of the multiple layout scenarios comprising:
- identifying, determining, or updating physical data of the first layout scenario;
- characterizing an electrical parasitic associated with the physical data;
- characterizing an electrical characteristic associated with the electrical parasitic or the physical data;
- identifying or determining a constraint associated with the electrical characteristic; and
- ensuring correctness of the physical data or other physical data related to the constraint.

34. The article of manufacture of claim 29, in which the action of characterizing the each of the multiple layout scenarios comprises:
- performing a schematic simulation for the electronic circuit design;
- assembling at least current or voltage information based at least in part upon a result of the schematic simulation; and
- determining the electrical characteristic in a physical domain by using a solver, wherein the action of determining the electrical characteristic in the physical domain by using the solver comprising:
  - forming a matrix by using at least the electrical parasitic;
  - determining a first electrical characteristic by using at least the matrix; and
  - determining the electrical characteristic by using at least the first electrical characteristic.

35. A system for implementing multi-scenario physically-aware design of an electronic circuit design, comprising:
- at least one processor or at least one processor core that is to:
- identify or generate a physical design of at least a part of the electronic design;
- identify a layout scenario from multiple layout scenarios, the layout scenario being a partial, incomplete layout and comprising a parameterized cell;
- update the physical design by using a first instance of the parameterized cell in the layout scenario; and
- perform at least one of scenario recognition, scenario lookup, and scenario switch.

36. The system of claim 35, in which the at least one processor or at least one processor core to perform the scenario switch is further to:
- perform automatic scenario switch without requiring human intervention; or perform assisted scenario switch by interacting with a user to provide the user with an option to modify an intrinsic parameter or an extrinsic parameter of the parameterized cell.

37. The system of claim 36, in which the at least one processor or at least one processor core to perform the automatic scenario switch is further to:
  perform automatic placement, floorplanning, or routing to improve a cellview of at least a part of the first layout scenario; or
  perform automatic placement, floorplanning, or routing to improve an intrinsic parameter or an extrinsic parameter for the first instance of the parameterized cell.

38. The system of claim 35, in which the at least one processor or the at least one processor core to perform the scenario recognition or the scenario lookup is further to:
  identify an intrinsic parameter or an extrinsic parameter for the first instance;
  determine whether the intrinsic parameter or the extrinsic parameter for the first instance matches with a first parameter of a first layout scenario in a data structure; or
  update the physical design with the first layout scenario, wherein the first parameter of the first layout scenario is determined to match with the intrinsic parameter or the extrinsic parameter.

39. The system of claim 38, in which the at least one processor or at least one processor core to perform the scenario recognition or the scenario lookup is further to:
  update the physical design with a second layout scenario, wherein the first parameter of the first layout scenario is determined not to match with the intrinsic parameter or the extrinsic parameter, and a second parameter of the second layout scenario is determined to be a closest match with the intrinsic parameter or the extrinsic parameter;
  characterize the physical design based at least in part upon the second layout scenario; or
  report a layout switch violation, wherein the first parameter of the first layout scenario is determined not to match with the intrinsic parameter or the extrinsic parameter, and a second parameter of the second layout scenario is determined to be a closest match with the intrinsic parameter or the extrinsic parameter.

40. An article of manufacture comprising a non-transitory computer readable storage medium having a sequence of instructions stored thereupon which, when executed by at least one processor or at least one processor core, causes the at least one processor or the at least one processor core to perform a method for implementing multi-scenario physically-aware design of an electronic circuit design, the method comprising:
  using at least one processor or at least one processor core to perform a process the process comprising:
  identifying or generating a physical design of at least a part of the electronic design;
  identifying a layout scenario from multiple layout scenarios, the layout scenario being a partial, incomplete layout and comprising a parameterized cell;
  updating the physical design by using a first instance of the parameterized cell in the layout scenario; and
  performing at least one of scenario recognition, scenario lookup, and scenario switch.

41. The article of manufacture of claim 40, in which the action of performing the scenario switch comprises at least one of:
  performing automatic scenario switch without requiring human intervention; and
  performing assisted scenario switch by interacting with a user to provide the user with an option to modify an intrinsic parameter or an extrinsic parameter of the parameterized cell.

42. The article of manufacture of claim 40, in which the action of performing the automatic scenario switch comprises at least one of:
  performing automatic placement, floorplanning, or routing to improve a cellview of at least a part of the first layout scenario; and
  performing automatic placement, floorplanning, or routing to improve an intrinsic parameter or an extrinsic parameter for the first instance of the parameterized cell.

43. The article of manufacture of claim 40, in which the action of performing the scenario recognition or the scenario lookup comprises at least one of:
  identifying an intrinsic parameter or an extrinsic parameter for the first instance;
  determining whether the intrinsic parameter or the extrinsic parameter for the first instance matches with a first parameter of a first layout scenario in a data structure; and
  updating the physical design with the first layout scenario, wherein the first parameter of the first layout scenario is determined to match with the intrinsic parameter or the extrinsic parameter.

44. The article of manufacture of claim 43, in which the action of performing the scenario recognition or the scenario lookup further comprises at least one of:
  updating the physical design with a second layout scenario, wherein the first parameter of the first layout scenario is determined not to match with the intrinsic parameter or the extrinsic parameter, and a second parameter of the second layout scenario is determined to be a closest match with the intrinsic parameter or the extrinsic parameter;
  characterizing the physical design based at least in part upon the second layout scenario; and
  reporting a layout switch violation, wherein the first parameter of the first layout scenario is determined not to match with the intrinsic parameter or the extrinsic parameter, and a second parameter of the second layout scenario is determined to be a closest match with the intrinsic parameter or the extrinsic parameter.

* * * * *